(12) United States Patent
Shin et al.

(10) Patent No.: US 8,363,209 B2
(45) Date of Patent: Jan. 29, 2013

(54) METHOD AND APPARATUS TO ADJUST MISALIGNMENT OF THE MASKLESS EXPOSURE APPARATUS

(75) Inventors: Young Hoon Shin, Seocho-gu (KR); Won Ho Seo, Seocho-gu (KR); Myung Ju Park, Seocho-gu (KR); Hyung Jin Lee, Seocho-gu (KR); Sang Hwan Cha, Seocho-gu (KR); Tae Ho Lee, Seocho-gu (KR); Chang Ju Rhee, Seocho-gu (KR)

(73) Assignee: LG Electronics Inc., Seoul (KR)

( * ) Notice: Subject to any disclaimer, the term of this patent is extended or adjusted under 35 U.S.C. 154(b) by 411 days.

(21) Appl. No.: 12/452,565

(22) PCT Filed: Jun. 25, 2008

(86) PCT No.: PCT/KR2008/003632
§ 371 (c)(1),
(2), (4) Date: Mar. 23, 2010

(87) PCT Pub. No.: WO2009/008605
PCT Pub. Date: Jan. 15, 2009

(65) Prior Publication Data
US 2010/0208229 A1 Aug. 19, 2010

(30) Foreign Application Priority Data

| Jul. 10, 2007 | (KR) | 10-2007-0069238 |
| Jul. 10, 2007 | (KR) | 10-2007-0069282 |
| Jul. 23, 2007 | (KR) | 10-2007-0073431 |
| Oct. 2, 2007 | (KR) | 10-2007-0099194 |

(51) Int. Cl.
*G03B 27/54* (2006.01)
*G03B 27/68* (2006.01)
*G03B 27/42* (2006.01)
*G03B 27/32* (2006.01)
*G03B 27/52* (2006.01)
*G03B 27/58* (2006.01)

(52) U.S. Cl. .............. 355/67; 355/52; 355/53; 355/55; 355/72; 355/77

(58) Field of Classification Search .................. 355/52, 355/53, 55, 67–71, 72, 77; 356/399–401; 250/492.1, 492.2, 492.22, 548
See application file for complete search history.

(56) References Cited

U.S. PATENT DOCUMENTS

| 5,576,829 | A | * | 11/1996 | Shiraishi et al. | 356/521 |
| 6,061,606 | A | * | 5/2000 | Ross | 700/121 |
| 6,498,685 | B1 | * | 12/2002 | Johnson | 359/626 |
| 6,515,734 | B1 | * | 2/2003 | Yamada et al. | 355/54 |
| 7,023,526 | B2 | | 4/2006 | Latypov et al. | |
| 7,164,465 | B2 | | 1/2007 | Klosner et al. | |
| 7,411,651 | B2 | * | 8/2008 | Ostrom et al. | 355/53 |
| 2004/0053143 | A1 | * | 3/2004 | Sandstrom | 430/5 |

(Continued)

FOREIGN PATENT DOCUMENTS
WO   WO 2006098391 A1 * 9/2006

*Primary Examiner* — Toan Ton
*Assistant Examiner* — Christina Riddle
(74) *Attorney, Agent, or Firm* — McKenna Long & Aldridge LLP

(57) ABSTRACT

Disclosed is a maskless exposure method, where it is possible to perform a more precise optical alignment using a first pattern of a maskless exposure part and a second pattern of a main reference unit, and it is also possible to reduce generation of a blur in an exposed pattern.

25 Claims, 42 Drawing Sheets

U.S. PATENT DOCUMENTS

| | | | |
|---|---|---|---|
| 2004/0053148 A1* | 3/2004 | Morohoshi | 430/30 |
| 2004/0189970 A1* | 9/2004 | Takada | 355/67 |
| 2004/0239901 A1 | 12/2004 | Wasserman et al. | |
| 2006/0001855 A1* | 1/2006 | Lof et al. | 355/69 |
| 2006/0103831 A1* | 5/2006 | Ottens et al. | 355/72 |
| 2008/0260234 A1* | 10/2008 | Yamashita | 382/144 |

* cited by examiner (a) Result of 25% overlap

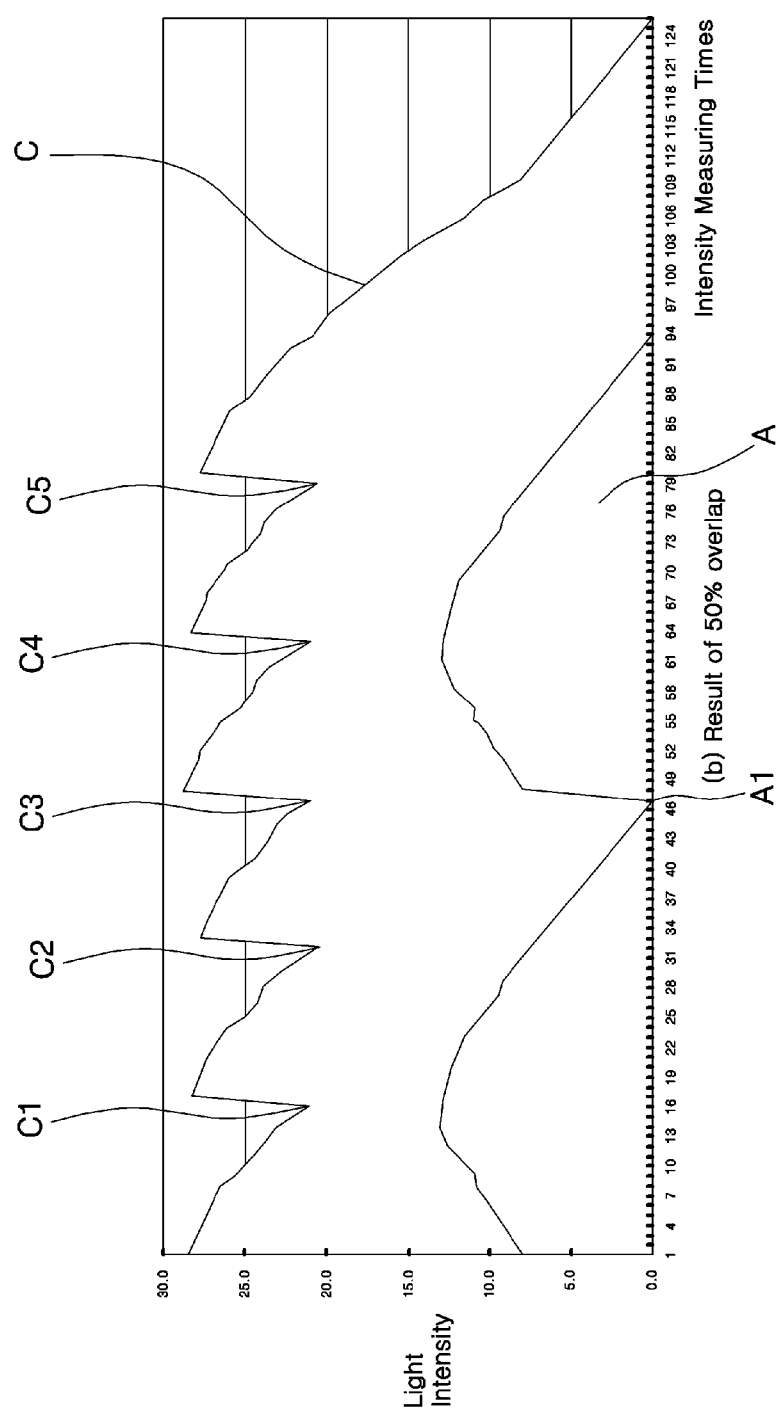

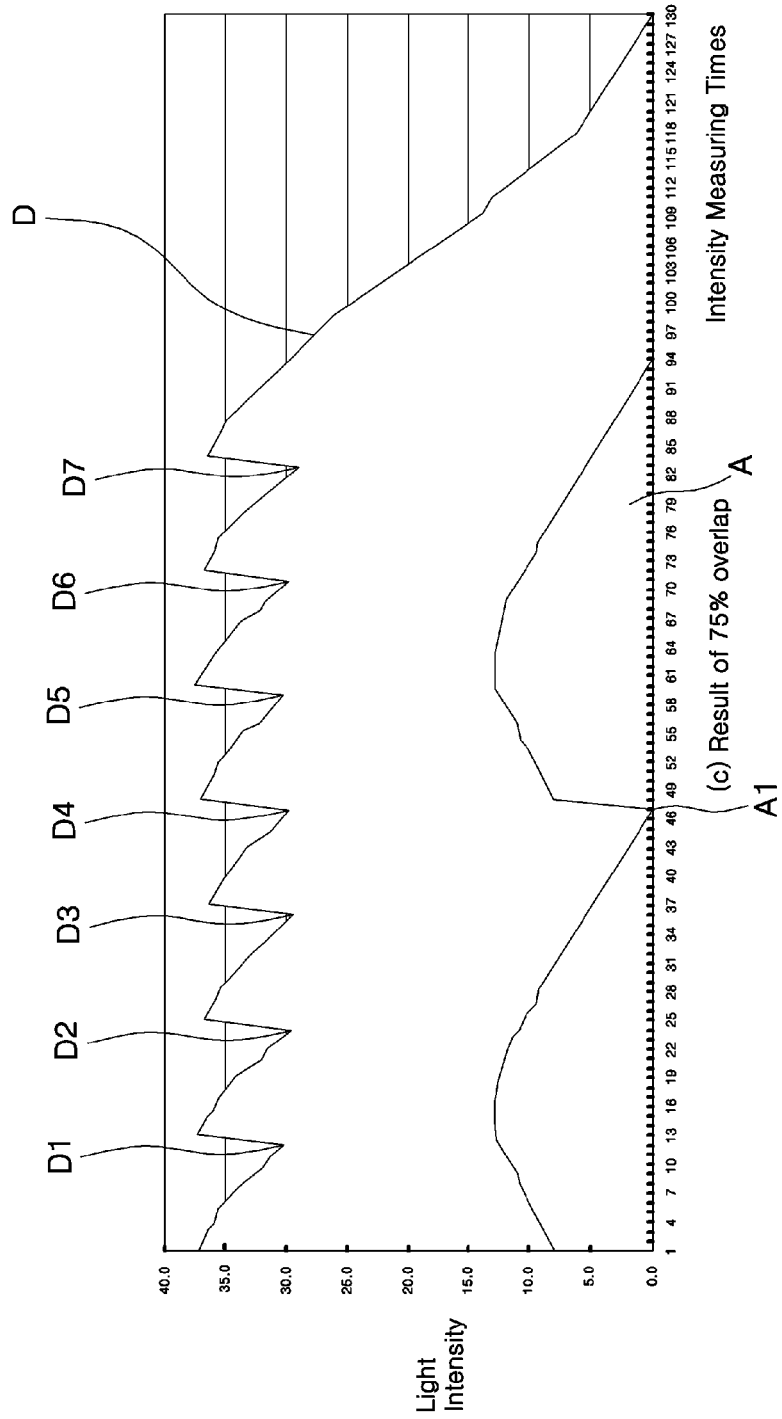

METHOD AND APPARATUS TO ADJUST MISALIGNMENT OF THE MASKLESS EXPOSURE APPARATUS

This application claims the benefit of Korean Patent Application Nos. 10-2007-0069282 filed on Jul. 10, 2007, 10-2007-0069238 filed on Jul. 10, 2007, 10-2007-0073431 filed on Jul. 23, 2007, 10-2007-0099194 filed on Oct. 2, 2007 and PCT Application No. PCT/KR2008/003632, filed on Jun. 25, 2008, which is hereby incorporated by reference for all purposes as if fully set forth herein.

TECHNICAL FIELD

The following description relates generally to a maskless exposure method.

BACKGROUND ART

Recently, with rapid development of an information society, a need for a flat panel display (FPD) having excellent properties such as slim thickness, light weight and low power consumption has been raised.

To meet this need, there has been developed image display panels such as a Liquid Crystal Display (LCD), a Plasma Display Panel (PDP), an Electroluminescent Display (ELD) and a Vacuum Fluorescent Display (VFD).

Among these panels, the LCD panel has been actively used for a notebook computer or a desktop monitor owing to its excellent resolution, color displaying ability and image quality.

Meanwhile, as the panels are enlarged according to customer demands, various processing facilities have been developed and facilities using new technologies have been developed.

In particular, an exposure apparatus is essential for forming patterns in each display panel, and performs a function that receives light from an illumination apparatus and transmits the light through a pattern of a photomask to image on a layer to be exposed, thereby exposing the layer.

FIG. 1 is a schematic sectional view illustrating a conventional exposure process. A light emitted from a light source 10 is irradiated to a photosensitive layer 30 on an upper portion of a substrate 40 according to patterns of a photomask 20 and thus the photosensitive layer 30 is exposed according to the pattern shape.

In this conventional exposure process, when an exposure area is a large area, a plurality of lighting devices is required to expose this large area. However, there is a problem in that a precise exposure process cannot be performed due to generation of a light intensity deviation between the lighting devices.

DISCLOSURE OF INVENTION

Technical Problem

An object of the instant disclosure is to provide a maskless exposure method capable of performing a more precise optical alignment using a first pattern of a maskless exposure part and a second pattern of a Main Reference Unit (MRU).

Another object is to provide a maskless exposure method capable of aligning optical centers of a Digital Micromirror Device (DMD), a Multi-Array Lens (MAL) and the MRU by providing an aligning camera.

Further object is to provide a maskless exposure method capable of correcting angles of the DMD and MAL, a magnification of a projection lens, spaces between Y-axes and X-axes of projection lenses for an exposure using a light having a first pattern reflected from the DMD and a second pattern of the MRU.

Still further object is to provide a maskless exposure method, which can decrease a threshold light quantity to correct a Critical Dimension (CD) so that a CD of the exposed pattern is within a reference CD range, thereby reducing generation of a blur in an exposed pattern.

Still further object is to provide a maskless exposure method which can measure an intensity of an exposure part and generates a blank image capable of turning some of the pixels of the DMD, thereby removing light intensity deviation and reducing generation of the blur in the exposed pattern using this blank image.

Still further object is to provide a maskless exposure method, which can subdivide a trace of a stage scanned with the maskless exposure part, extract a focus distance of the maskless exposure part at the subdivided positions and perform the exposure at the subdivided positions while maintaining the focus distance extracted at the subdivided positions, thereby setting focus while preventing mechanical interference even when a plurality of exposure parts are arrayed.

Yet another object is to provide a maskless exposure method, which can overlap the exposure pattern and thus make the light intensity uniform by cancelling intensity profile in an overlapped exposure region, thereby removing blurs in the exposed pattern.

Technical Solution

In one general aspect, a maskless exposure method comprises:

preparing a maskless exposure part including a light source for projecting a light, a Spatial Light Modulator (SLM) for reflecting the light projected from the light source as a light having a first pattern, a Multi-Array Lens (MAL) arrayed with a plurality of lenses so as to divide the light having the first pattern reflected from the SLM into a plurality of lights and collect the divided lights, and a projection lens for controlling resolutions of the lights collected by the MAL and transmitting the resultant lights;

irradiating the light of the first pattern from the maskless exposure part to a Main Reference Unit (MRU) formed of a light transmissive material and formed with a second pattern that does not transmit the light having the first pattern;

photographing the light transmitted through the MRU at a MRU camera;

calculating a misalignment error with the first and second patterns represented in an image photographed by the MRU camera; and moving and aligning the MAL or the SLM for correcting the misalignment error.

Advantageous Effects

According to the present disclosure, there is an advantage in that it is possible to perform a more precise optical alignment using the first pattern of the maskless exposure part and the second pattern of the MRU.

There is another advantage in that the aligning camera is provided capable of aligning optical centers of the DMD, MAL and MRU.

BRIEF DESCRIPTION OF THE DRAWINGS

FIGS. 68 through 70 are graphs illustrating the light intensity distribution of the overlapped region according to the present disclosure.

BEST MODE FOR CARRYING OUT THE INVENTION

Now, exemplary implementations of the present inventive disclosure will be described in detail with reference to the accompanying drawings.

Figure 1:
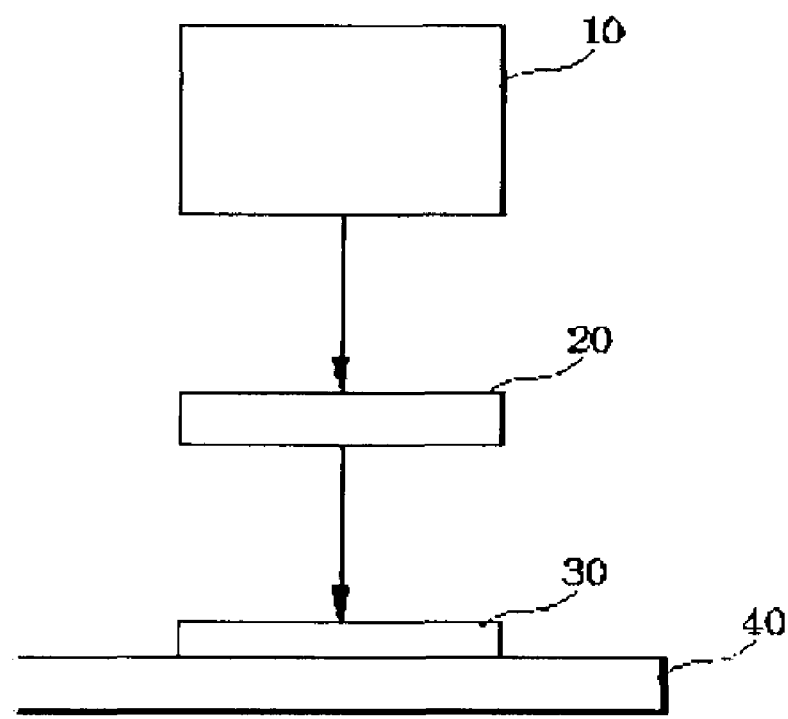
FIG. 1 is a schematic sectional view illustrating a conventional exposure process.
Figure 2:
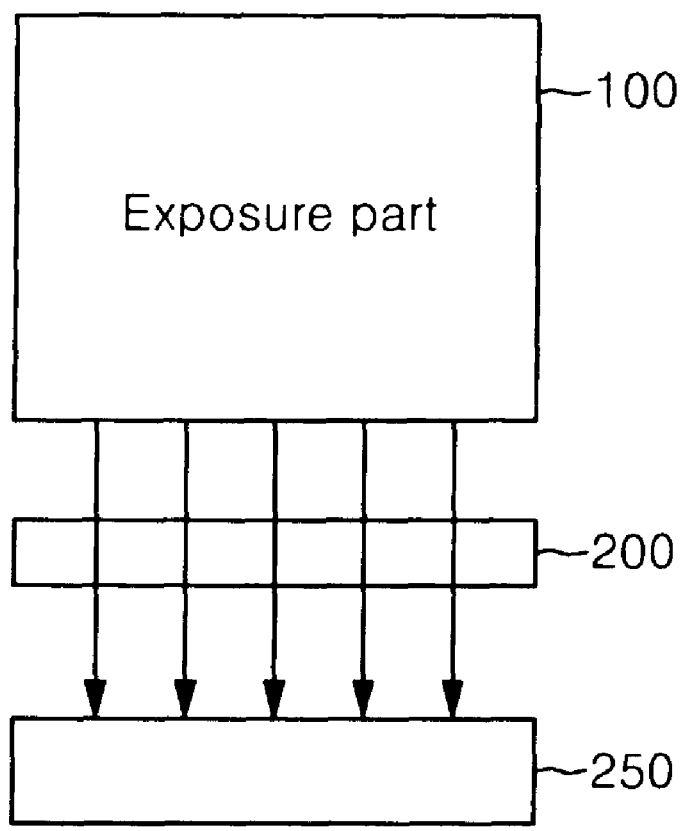
FIG. 2 is a schematic structural view illustrating a maskless exposure apparatus according to a first implementation of the present disclosure.

FIG. 2 is a schematic structural view illustrating a maskless exposure apparatus according to a first implementation of the present disclosure. The maskless exposure apparatus includes a maskless exposure part 100 for exposing a predetermined object with a light having a first pattern; a Master Reference Unit (MRU) 200 formed of a light transmissive material and formed with a second pattern that does not transmits the light having the first pattern; and a MRU camera 250 for photographing the light transmitted through the MRU 200.

Therefore, the maskless exposure apparatus of the present disclosure can perform optical alignment more precisely using the first pattern of the maskless exposure part 100 and the second pattern of the MRU 200.

Herein, the MRU 200 is a component for referring to an absolute reference of the maskless exposure apparatus.

Figure 3:
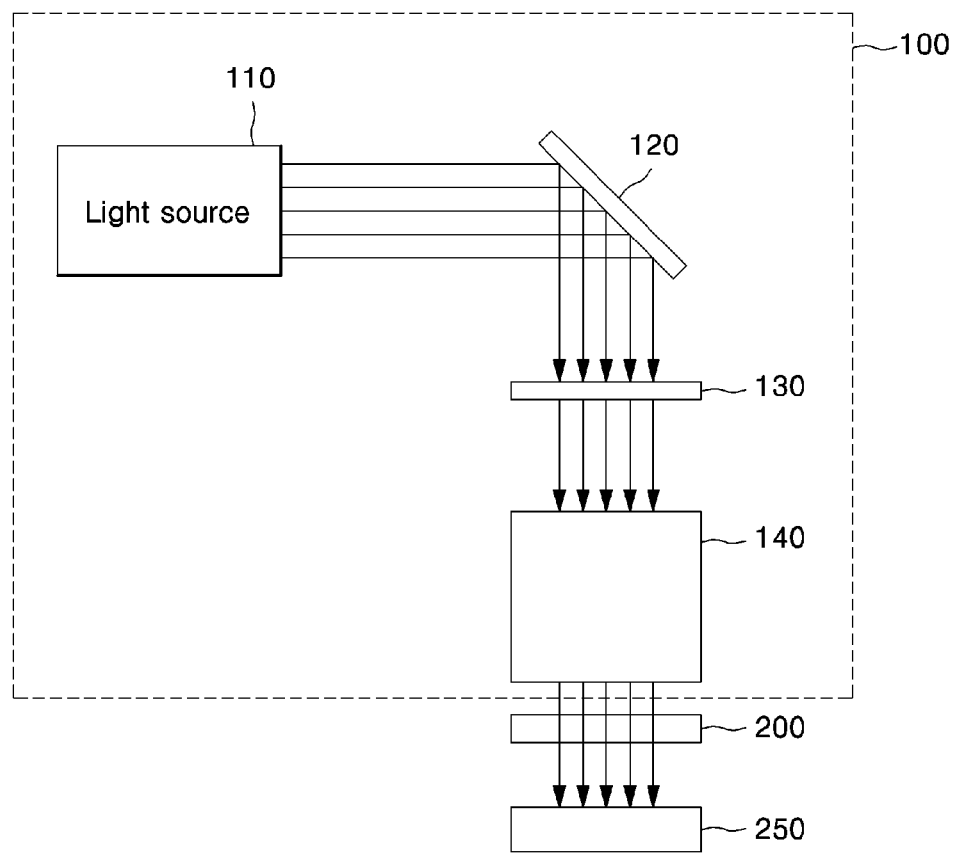
FIG. 3 is a schematic structural view illustrating a maskless exposure part according to the present disclosure.

FIG. 3 is a schematic structural view illustrating the maskless exposure part according to the present disclosure. The maskless exposure part includes a light source 110 for projecting a light, a Spatial Light Modulator (SLM) 120 for reflecting the light projected from the light source 110 as a light having the first pattern, a Multi-Array Lens (MAL) 130 arrayed with a plurality of lenses so as to divide the light having the first pattern reflected from the SLM 120 into a plurality of lights and collects the divided lights, and a projection lens 140 for controlling resolutions of the lights collected by the MAL 130 and transmitting the resultant lights.

In the maskless exposure part constituted as described above, the light source 110 projects the light and the SLM 120 reflects the light projected from the light source 110 as the light having the first pattern.

Then, the MAL 130 divides the first light having the first pattern reflected from the SLM 120 into a plurality of lights and collects the divided lights, and the projection lens 140 controls the lights collected by the MAL 130 and transmits the resultant lights, thereby capable of performing an exposure without a mask.

Figure 4:
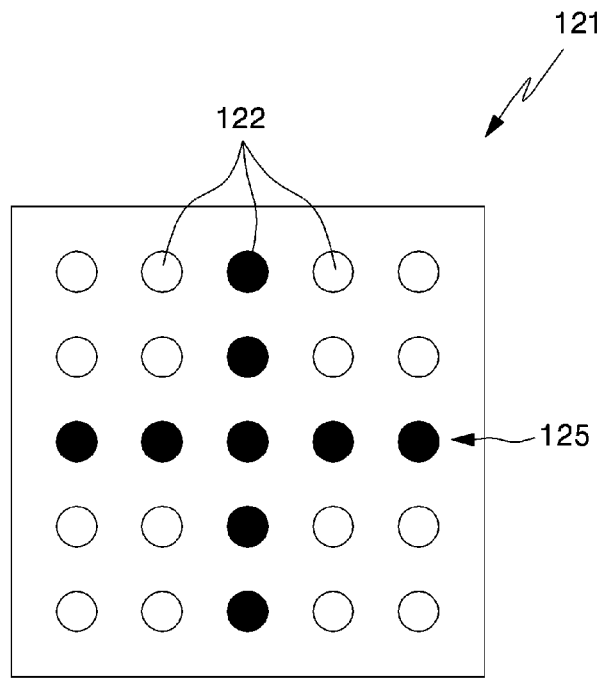
FIG. 4 is a schematic view of an example of the light having a first pattern reflected from a SLM according to the present disclosure.

FIG. 4 is a schematic view of an example of the light having the first pattern reflected from the SLM according to the present disclosure. The SLM selectively reflects the light of the light source by an external signal and thus the reflected light comes to have a pattern shape.

Therefore, by the SLM, the exposure part can generate a light pattern and perform an exposure without using a mask.

In the present disclosure, it is preferable that the SLM be a Digital Micromirror Device (DMD) 121.

This DMD is arrayed with a plurality of micromirrors that selectively reflect the light of the illuminating part and thus can project the patterned light by selectively driving the plurality of the micromirrors according to image data and thus reflecting some of the light from the light source.

Meanwhile, the first pattern applied in the present disclosure is preferably made by a region in the DMD from which the light is not reflected.

That is to say, as shown in FIG. 4, the plurality of the micromirrors of the DMD is selectively driven to reflect the light and thus a cross-shaped region from which the light is not reflected is present.

Herein, in FIG. 4, a plurality of the micromirrors 122 is schematically shown in a circular shape, and white circles denote the micromirrors that are driven and black circles denote the micromirrors that are not driven.

Therefore, the black circular shaped micromirrors become the region from which the light is not reflected and are shown in a cross-shaped pattern in FIG. 4.

This cross-shape becomes the aforementioned first pattern 125.

Figure 5:
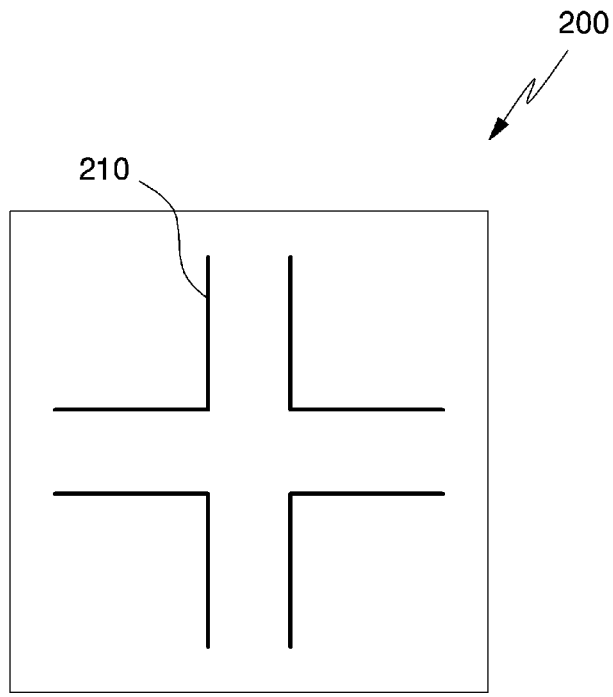
FIG. 5 is a schematic view illustrating an example of the second pattern formed in a MRU according to the present disclosure.

FIG. 5 is a schematic view illustrating an example of the second pattern formed in the MRU according to the present disclosure. The MRU 200 applied in the present disclosure is formed with a mark which does not transmit the light and the mark becomes the second pattern 210 formed in the MRU 200.

The MRU 200 is manufactured using a material which is insensitive to variation of an external environment such as a temperature and thus has a deformation close to zero.

Therefore, it is preferable that the MRU 200 transmit the light and the second pattern 210 be made by the mark in the MRU 200 which does not transmit the light.

That is to say, in FIG. 5, the second pattern 210 is realized as the mark 240 which does not transmit the light is formed in the MRU 200 which transmits the light.

Figure 6:
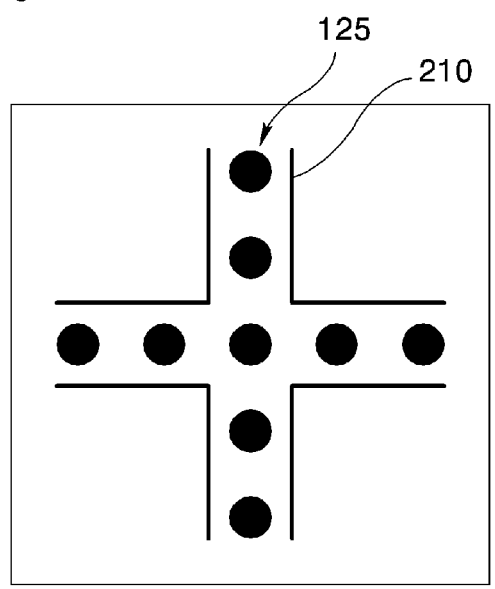
FIG. 6 is a view illustrating an example of an image inputted into the MRU camera according to the present disclosure.

FIG. 6 is a view illustrating an example of an image inputted into the MRU camera according to the present disclosure. Like the aforementioned FIG. 4, when the light of the first pattern reflected from the DMD is transmitted through the MRU, the first and second patterns 125 and 210 are represented in the image photographed by the MRU camera since the light cannot be transmitted through the second pattern of the MRU.

At this time, if the first and second patterns 125 and 210 are formed in similar patterns to each other, it is easy to compare the two patterns with each other and calculation of a misalignment error can thus be more facilitated.

Figure 7:
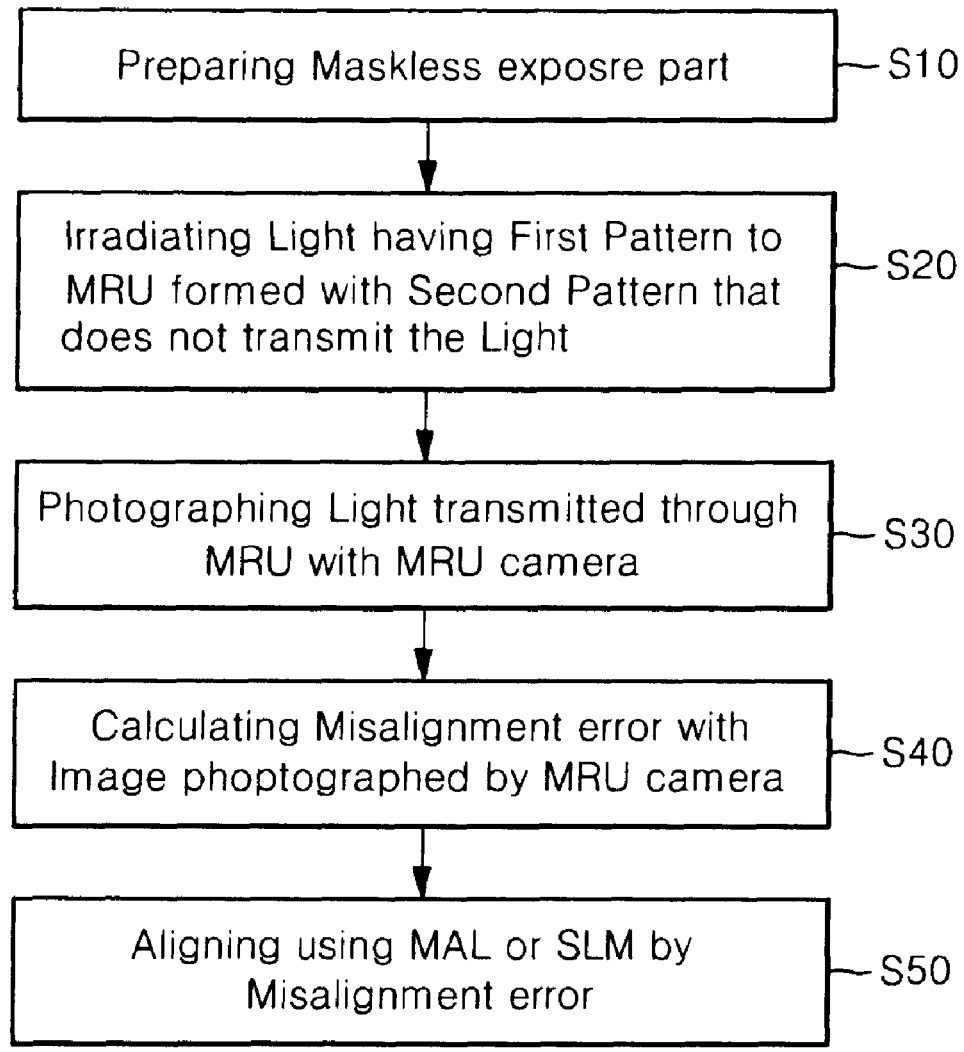
FIG. 7 is a flowchart illustrating a maskless exposure method according to the present disclosure.

FIG. 7 is a flowchart illustrating a maskless exposure method according to the present disclosure. First, a maskless exposure part including a light source for projecting a light, a SLM for reflecting the light projected from the light source as a light having a first pattern, a MAL arrayed with a plurality of lenses so as to divide the light having the first pattern reflected from the SLM into a plurality of lights and collects the divided lights, and a projection lens for controlling resolutions of the lights collected by the MAL and transmitting the resultant lights is prepared (Step S10).

After that, the maskless exposure part irradiates the light of the first pattern to a MRU formed of a light transmissive material and formed with a second pattern that does not transmit the light having the first pattern (Step S20).

After that, the MRU camera photographs the light transmitted through the MRU (Step S30).

Subsequently, a misalignment error is calculated with the first and second patterns represented in an image photographed by the MRU camera (Step S40).

Since the first and second patterns are represented in the image photographed by the MRU camera, it is possible to calculate the misalignment error by comparing the first and second patterns.

That is to say, in the present disclosure, the second pattern may be used as an absolute reference for correcting the exposure apparatus.

Subsequently, in order to correct the misalignment error, the MAL or the SLM is moved to perform the correction (Step S60).

At this time, the MAL or the SLM is provided with a moving stage and the moving stage moves a by an amount of movement capable of correcting the misalignment error.

The aforementioned steps S10 through S60 are performed prior to or during an exposure process.

Figure 8:
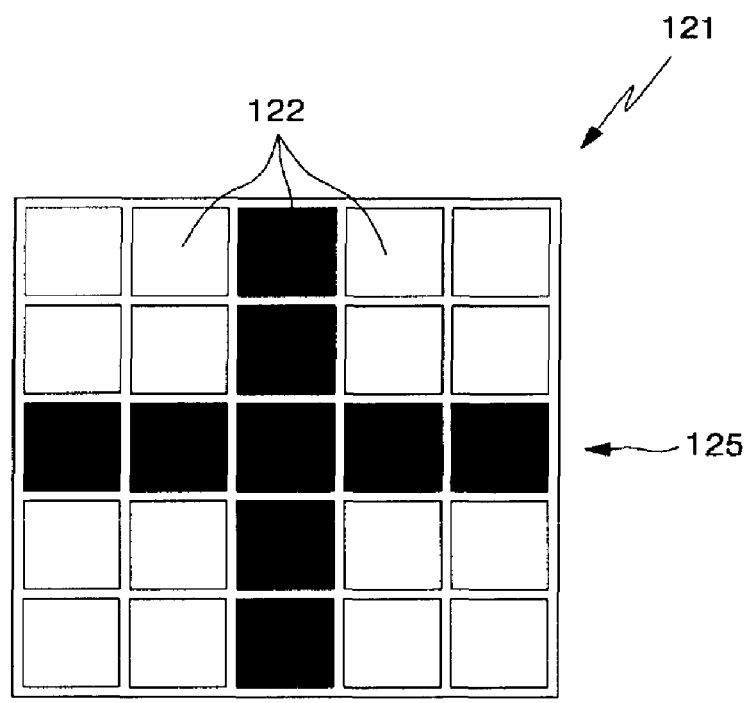
FIGS. 8 through 10 are views illustrating a state that there is no misalignment error between the SLM and the MAL according to the present disclosure.
Figure 9:
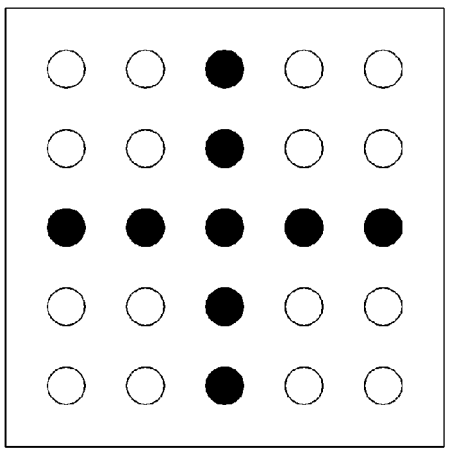
Figure 10:
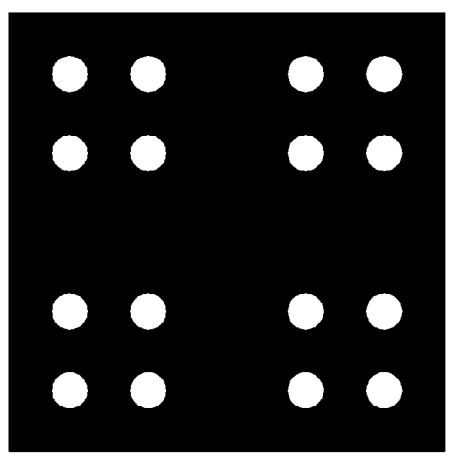

FIGS. 8 through 10 are views illustrating a state that there is no misalignment error between the SLM and the MAL according to the present disclosure. As shown in FIG. 8, a plurality of micromirrors 122 of the DMD 121 is formed in a rectangular shape, and the plurality of micromirrors 122 are selectively driven and reflect the light to form the first pattern 125 of a cross-shape.

At this time, in a case that there is no misalignment error between the SLM and the MAL, a shape of the beam projected from the MAL is as shown in FIG. 9 and the image photographed by the MRU camera is as shown in FIG. 10.

Figure 11:
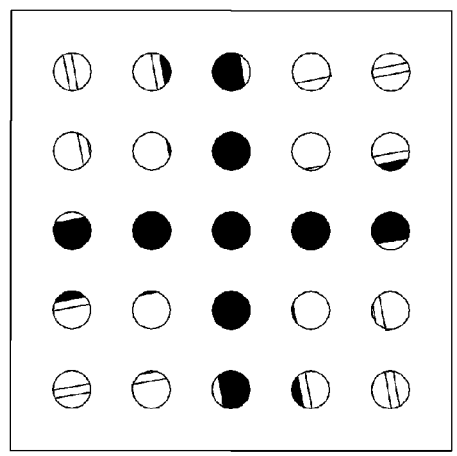
FIGS. 11 and 12 are views illustrating a state that there is a misalignment error between the SLM and the MAL according to the present disclosure.
Figure 12:
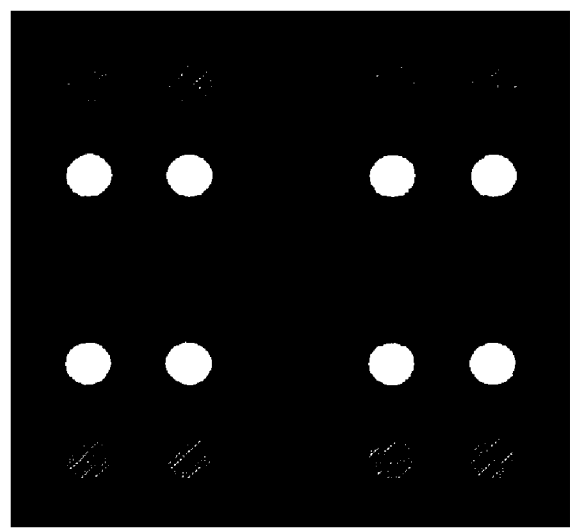

FIGS. 11 and 12 are views illustrating a state that there is a misalignment error between the SLM and the MAL according to the present disclosure. In the case that there is a misalignment error between the SLM and the MAL, when the light having the first pattern is reflected from the DMD as shown in FIG. 8, the shape of the beam projected from the MAL is as shown in FIG. 11 and the image photographed by the MRU camera is as shown in FIG. 12.

Figure 13:
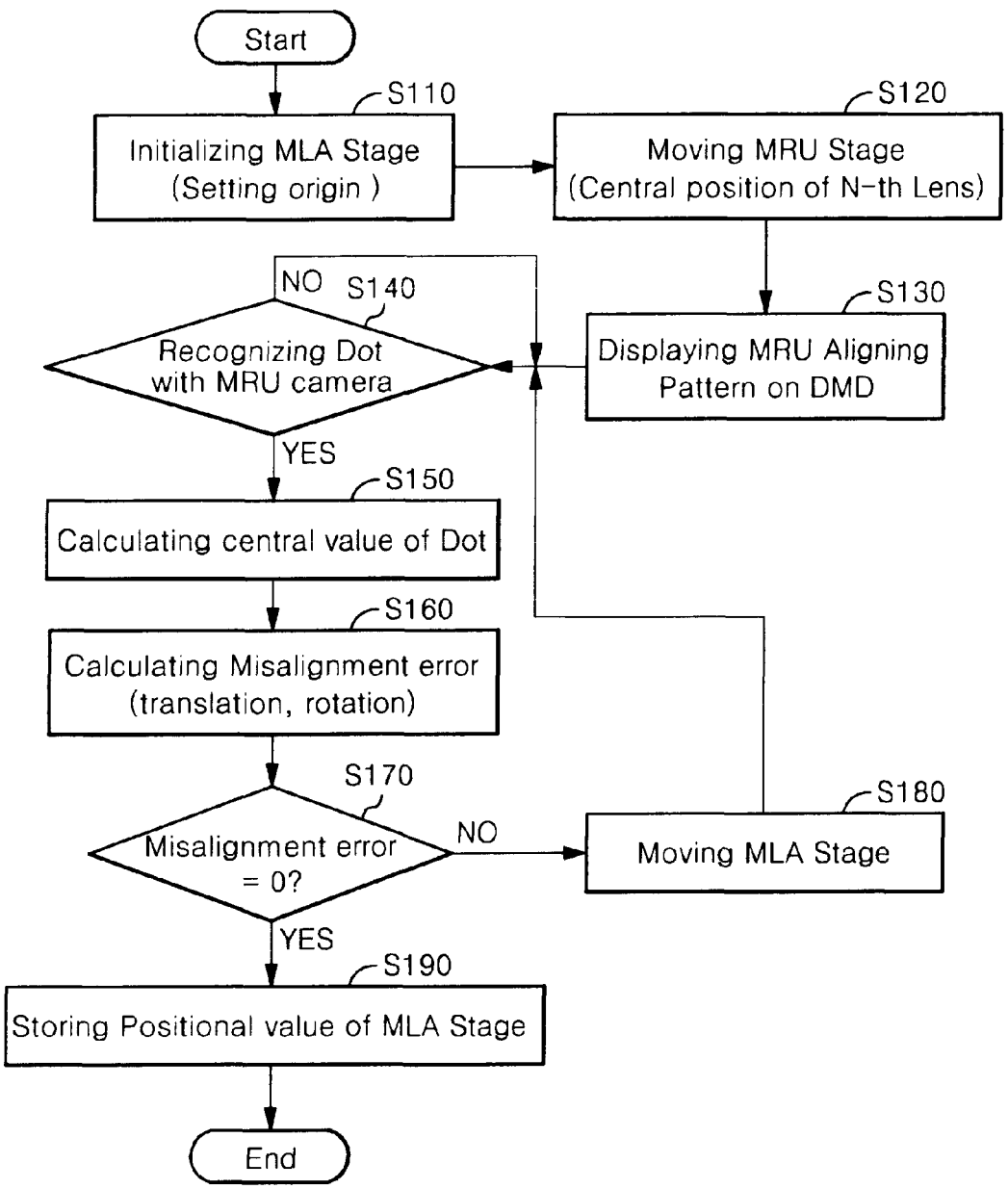
FIG. 13 is a flowchart illustrating a maskless exposure method according to a first implementation of the present disclosure.

FIG. 13 is a flowchart illustrating a maskless exposure method according to a first implementation of the present disclosure. The SLM in this implementation is a DMD.

First, a stage of the MAL is initialized (Step S110).

In other words, the stage of the MAL is set to an origin.

After that, the MRU stage is moved (Step S120).

Herein, the MRU stage is moved so that the center of the MRU is agreed with the center of a Nth projection lens of the maskless exposure part.

Subsequently, the DMD displays an alignment pattern (Step S130).

In other words, the DMD irradiates the first pattern.

Next, whether the MRU camera has recognized a dot transmitted through the second pattern of the MRU is determined (Step S140).

Herein, the dot refers to a dot placed in the first pattern and the first pattern is constituted of a plurality of dots.

If the MRU camera has recognized the dot, a central value of the dot is calculated (Step S150).

At this time, the central value of the dot means a central value of the first pattern constituted of the dots.

Subsequently, a misalignment error is calculated from the central value of the dot (Step S160).

Herein, to calculate the misalignment error with the central value of the dot is to calculate the error by comparing the central value of the first pattern with the central value of the second pattern.

Herein, the misalignment error includes a translation error and a rotation error.

Subsequently, whether the misalignment error is '0' is determined (Step S170).

If the misalignment error is '0', a positional value of the MAL stage is stored (Step S190), and if the misalignment error is not '0', the MAL stage is moved (Step S180).

The stage of the MAL is then moved by an amount of movement corresponding to the value of the misalignment error to be aligned.

Figure 14:
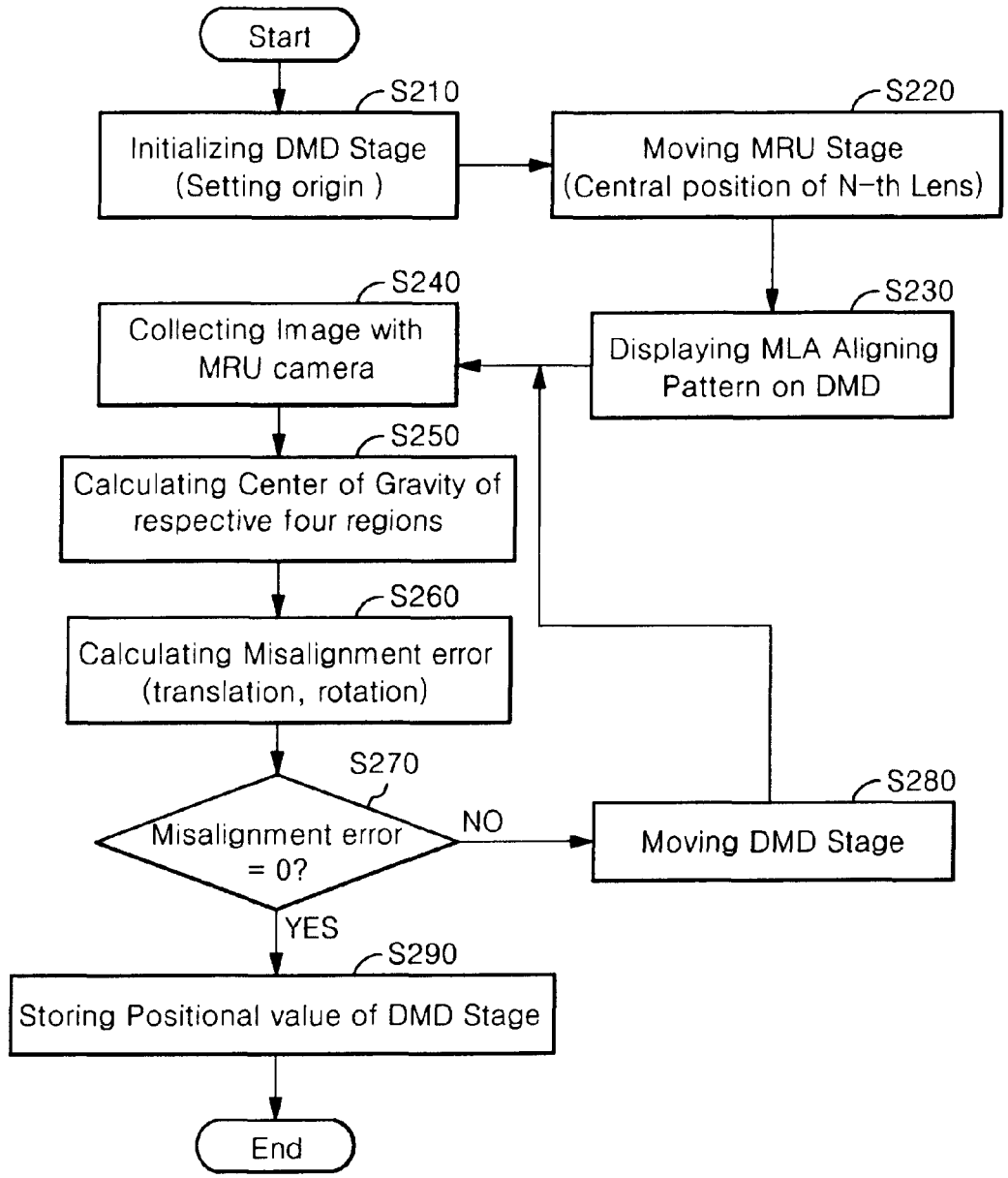
FIG. 14 is a flowchart illustrating another maskless exposure method according to a first implementation of the present disclosure.

FIG. 14 is a flowchart illustrating another maskless exposure method according to a first implementation of the present disclosure. The SLM in this implementation is a DMD.

First, a stage of the SLM is initialized (Step S210).

In other words, the stage of the SLM is set to an origin.

After that, the MRU stage is moved (Step S220).

Subsequently, the DMD displays an alignment pattern (Step S230).

In other words, the DMD irradiates the first pattern.

Subsequently, the MRU camera photographs the light transmitted through the second pattern of the MRU (Step S240).

Subsequently, a center of gravity on a per divided region basis in the image photographed by the MRU camera is calculated (Step S250).

Figure 16:
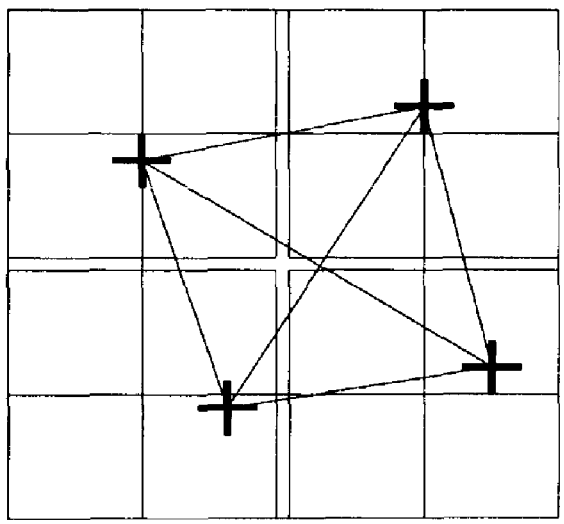

Referring to FIGS. 11 and 12, in a case a misalignment error between the SLM 120 and the MAL 130, the second pattern 210 is overlapped on an optical region from which the plurality of micromirrors 122 of digital micromirror element, and the optical region 220 overlapped with the second pattern 210 is reduced in brightness, and as shown in FIG. 16, with image brightness value of each region and a pixel position value, a weight center calculation may be used to calculate a rotation error amount subsequent to weight center of each region.

In other words, the center of gravity with respect to brightness of the divided region is calculated.

Next, a misalignment error is calculated from the calculated center of gravity (Step S260).

Herein, the misalignment error includes a translation error and a rotation error.

Subsequently, whether the misalignment error is '0' is determined (Step S270).

If the misalignment error is '0', a positional value of the SLM stage is stored (Step S290), and if the misalignment error is not '0', the SLM stage is moved (Step S280).

The stage of the SLM is then moved by an amount of movement corresponding to the value of the misalignment error to be aligned.

Figure 15:
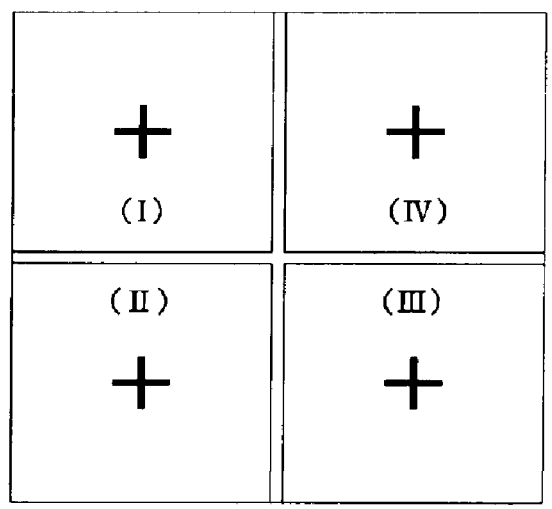
FIGS. 15 and 16 are views illustrating calculation of a center of gravity of divided regions in the MRU camera according to a first implementation of the present disclosure.

In other words, as shown in FIG. 15, in a case the photographed image is divided into four, it is possible to calculate the translation error by obtain the centers of gravity with respect to the brightness of the respective region and calculating mean coordinates of the respective centers of gravity.

Also, as shown in FIG. 16, it is possible to calculate the rotation error on the basis of a reference axis of the MRU camera by connecting the centers of gravity of the respective regions.

Meanwhile, the exposure methods of the aforementioned first and second implementations can be actually performed in real-time prior to or during the exposure process.

Figure 17:
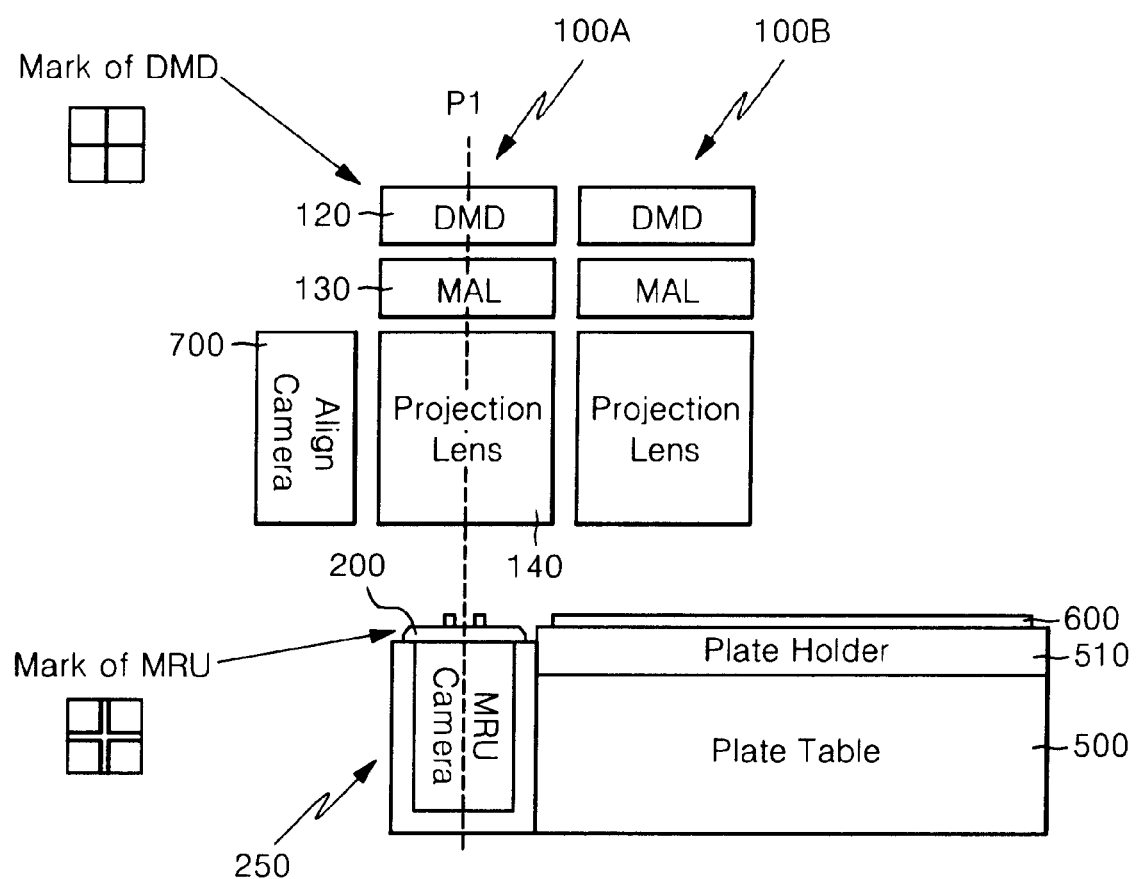
FIGS. 17 and 18 are schematic sectional views illustrating a state that coordinates of the DMD, the MAL and the MRU are aligned according to the present disclosure.
Figure 18:
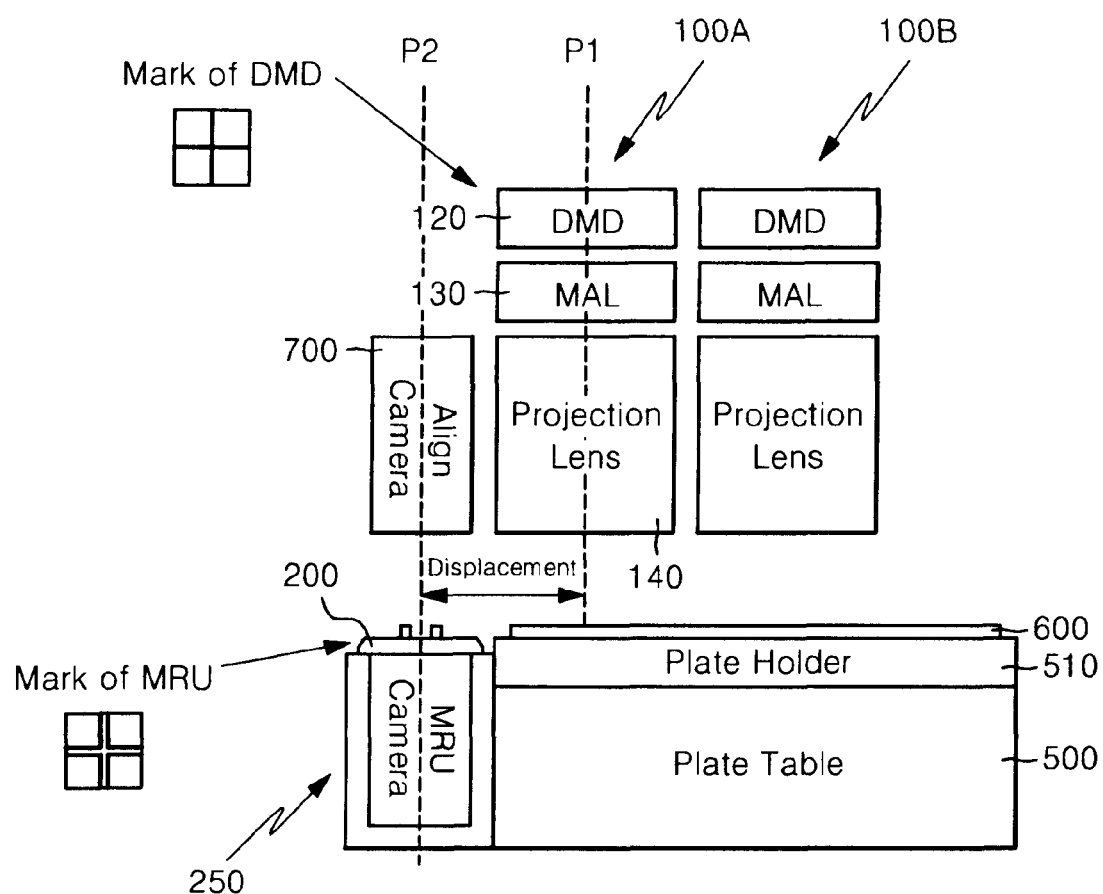

FIGS. 17 and 18 are schematic sectional views illustrating a state that coordinates of the DMD, the MAL and the MRU are aligned according to the present disclosure. First, a plate holder 510 is placed on an upper portion of a plate table 500 and a glass 600 is laid on an upper portion of the plate holder 510.

And, a plurality of maskless exposure parts 100A and 100B is aligned on the upper portion of the glass 600, and an aligning camera 700 is placed at a side portion of the plurality of maskless exposure parts 100A and 100B.

Meanwhile, since the maskless exposure apparatus has no mask formed with a pattern and a reference mark, all optical references should be precisely measured with a single coordinate system to be corrected and managed.

Therefore, in the present disclosure, as shown in FIG. 17, optical centers of the DMD 120 and the MAL 130 of a predetermined maskless exposure part 100A and the MRU 200 come to agree with a first axis P1.

In other words, the coordinate systems of the DMD 120, the MAL 130 and the MRU 200 are aligned.

After that, as shown in FIG. 18, the MRU camera 250 is moved in a scan direction so that the centers of the aligning camera 700 and the MRU 200 agree with a second axis P2.

Therefore, since an offset between the first and second axes P1 and P2 can be measured, it is possible to correct with this offset so that the optical centers of the DMD 120, the MAL 130 and the MRU 200 agree with one another.

It is preferable that this agreement process of the optical centers is performed after the step of moving and aligning the MAL or the SLM in order to correct the misalignment error in FIG. 7.

Consequently, the aligning camera 700 is provided so that its center is used to prepare a standard for aligning optical centers of the DMD 120, the MAL 130, and the MRU 200.

Also, the aligning camera 700 is provided to recognize the alignment mark of the glass loaded in the inside of the exposure apparatus in order to produce the pattern.

As described above, in the maskless exposure apparatus and method of the present disclosure, it is possible to mechanically precisely align essential components which determine the exposure quality with the measured offset.

It is preferable that the steps for calibrating the misalignment (described later) be further provided after the step S50 in FIG. 7 in which the MAL or the SLM is moved and aligned to calibrate the misalignment.

Figure 19:
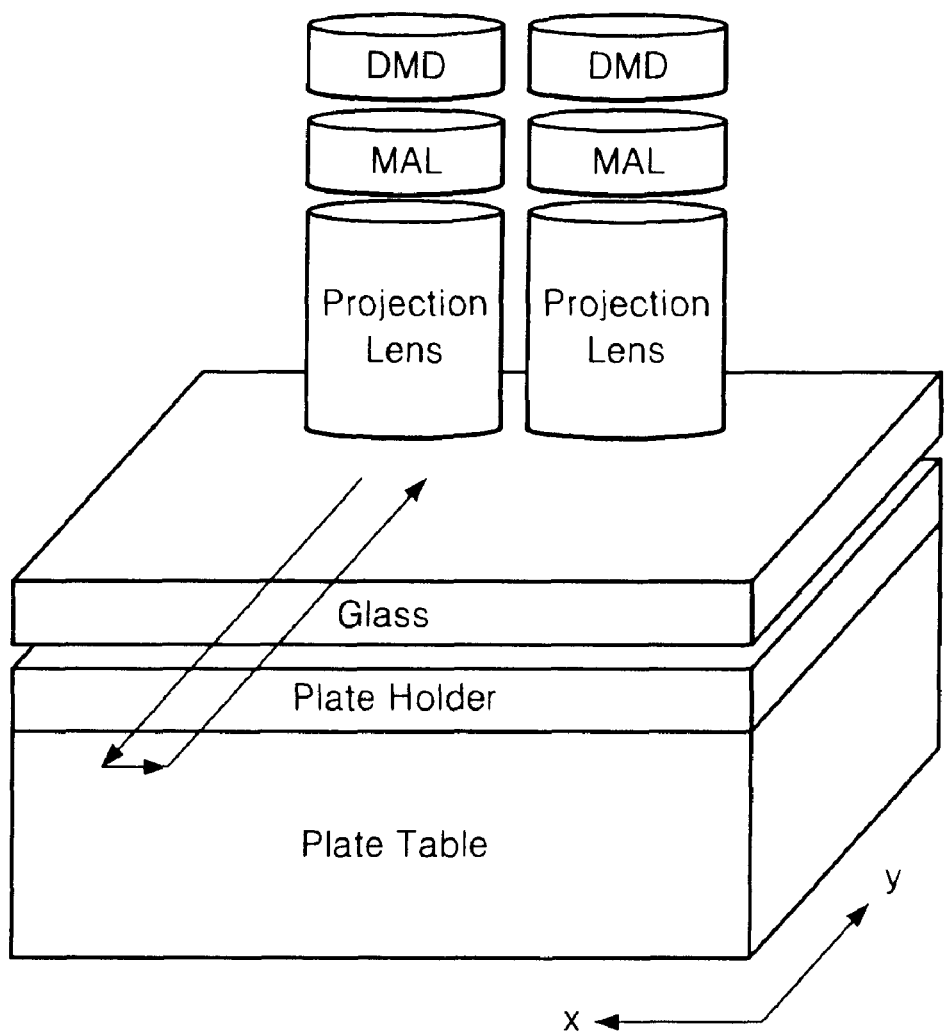
FIG. 19 is a view illustrating a method for correcting an angle according to the present disclosure.

FIG. 19 is a view illustrating a method for correcting an angle according to the present disclosure. As described above, the centers of the respective components are accurately aligned after aligning the maskless exposure part and the MRU, but whether angles of the DMD and the MAL are aligned with a scan axis is not confirmed.

Therefore, in the present disclosure, a stripe pattern is inputted into the DMD, a scan for exposure is performed at least two times and error in the respective scanned patterns is measured. The angles of the DMD and MAL are corrected with this measured error.

Herein, the stripe pattern corresponds to the aforementioned first pattern of the SLM.

Figure 20:
FIGS. 20 through 22 are views illustrating patterns for angle correction according to the present disclosure.
Figure 21:
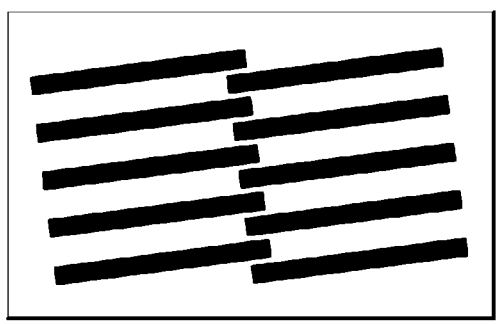

When the angles of the DMD and the MAL are not accurately aligned with the scan axis after the stripe pattern is irradiated from the DMD as shown in FIG. 20, the exposure is performed so that the positions of the respective scanned patterns are deviated from each other.

Figure 22:
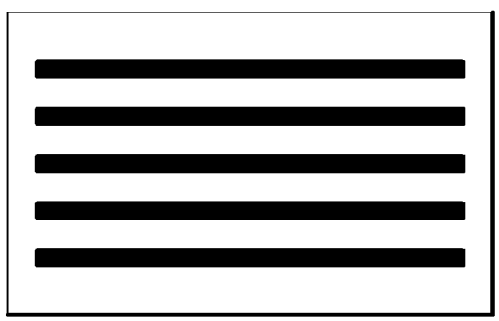

By adjusting the angles of the DMD and the MAL on the basis of measured error after the exposure and exposing again, the exposure is performed so that an exposed pattern agrees accurately with the input pattern of the DMD as shown in FIG. 22.

Figure 23:
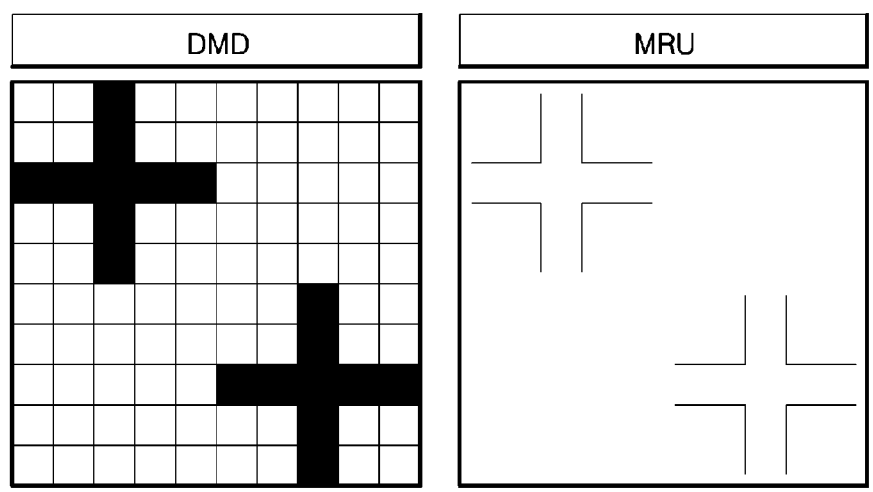
FIGS. 23 and 24 are views illustrating a method for correcting a magnification of the projection lens according to the present disclosure.
Figure 24:
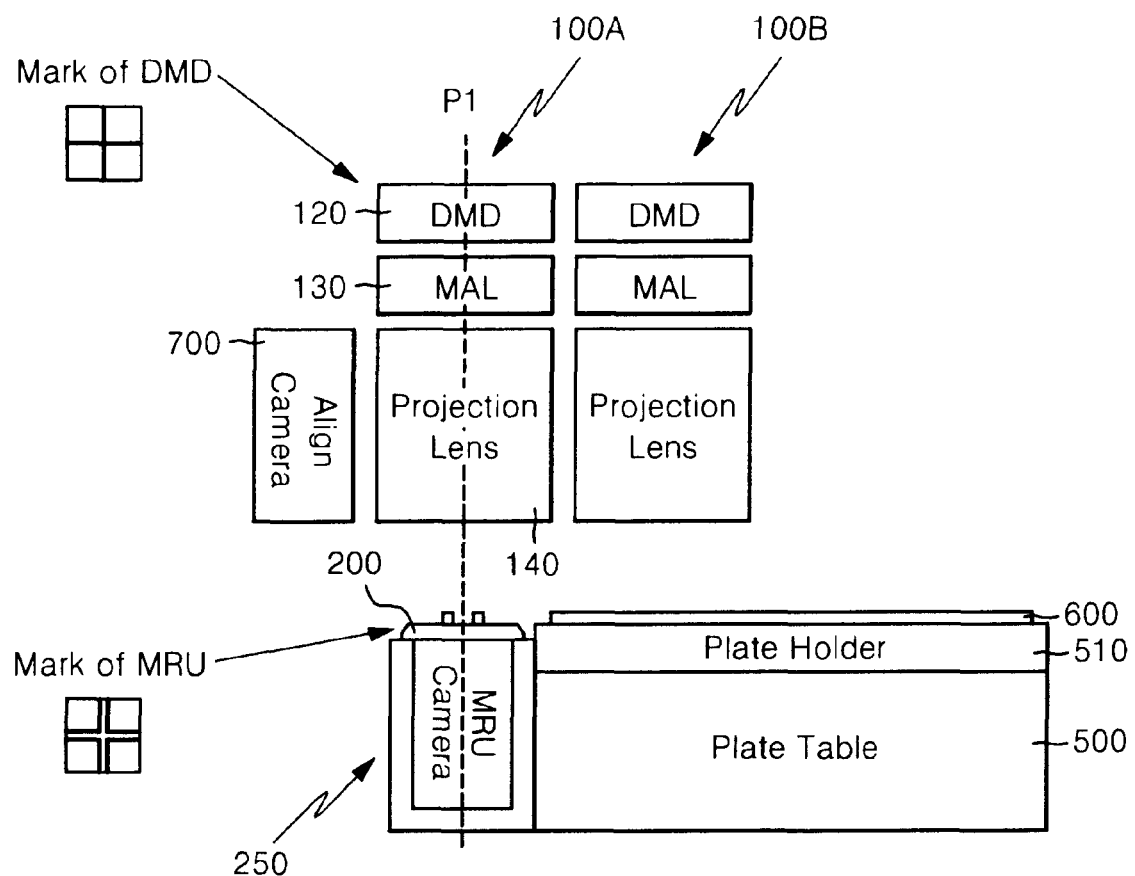

FIGS. 23 and 24 are views illustrating a method for correcting a magnification of the projection lens according to the present disclosure. In order to correct the magnification of the projection lens, at least two cross-shaped patterns are irradiated from the DMD in a direction of 45 degree and these patterns are compared with the second pattern of the MRU, thereby correcting the magnification of the projection lens.

At this time, the cross-shaped pattern irradiated from the DMD corresponds to the aforementioned first pattern.

At this time, the second pattern of the MRU is also formed in a pattern shape corresponding to the first pattern.

Therefore, as shown in FIG. 24, with the image photographed by the MRU camera, it is possible to measure and correct the magnification of the projection lens without the processes of exposure-development-dry while comparing the centers of the first pattern of the DMD and the second pattern of the MRU.

Figure 25:
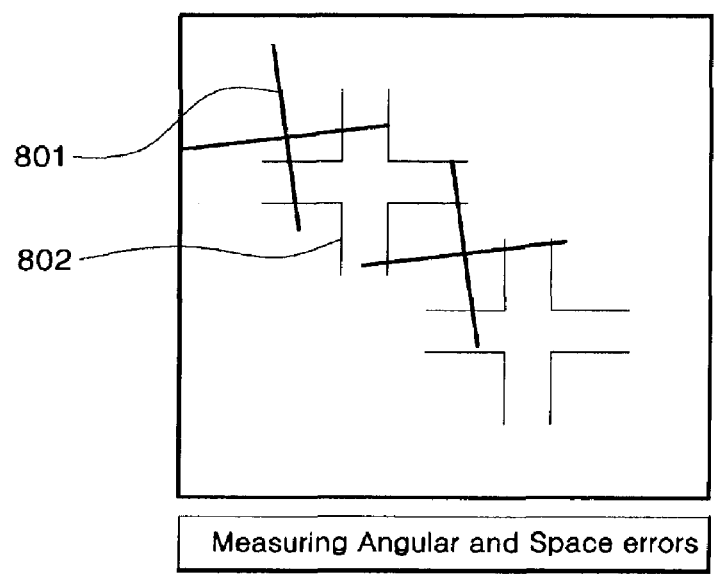
FIGS. 25 and 26 are views a state that an angle and a space of the projection lens are corrected according to the present disclosure.
Figure 26:
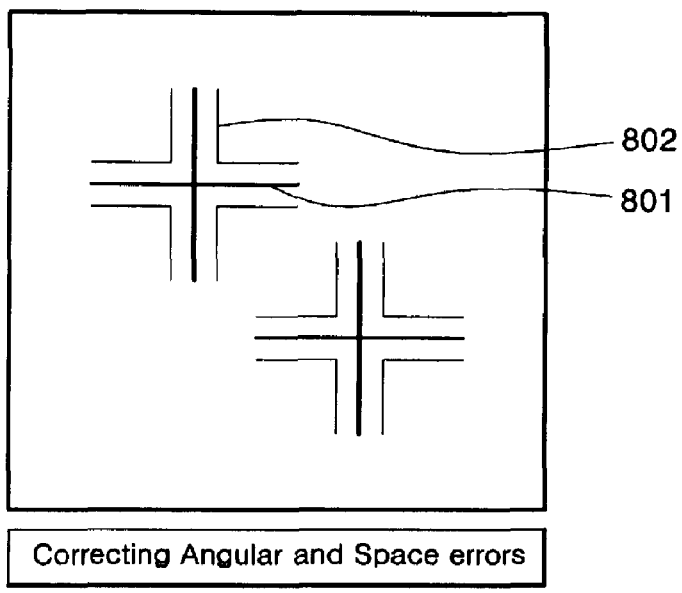

FIGS. 25 and 26 are views a state that an angle and a space of the projection lens are corrected according to the present disclosure. The angle and space of the projection lens can be corrected by comparing an imaginary light of the first pattern irradiated from the DMD with the second pattern of the MRU.

First, as shown in FIG. 25, in a case that the angle and space of the projection lens do not agree with each other, the imaginary light 801 of the first pattern irradiated from the DMD and the second pattern 802 of the MRU are deviated from each other.

In the state of being deviated, an error is measured and an individual stage is driven in real-time by this measured error to correct the error, thereby capable of obtaining more precise correction result.

Therefore, as shown in FIG. 26, although an actual exposure process is not performed, it is possible to correct the angle and space of the projection lens.

Figure 27:
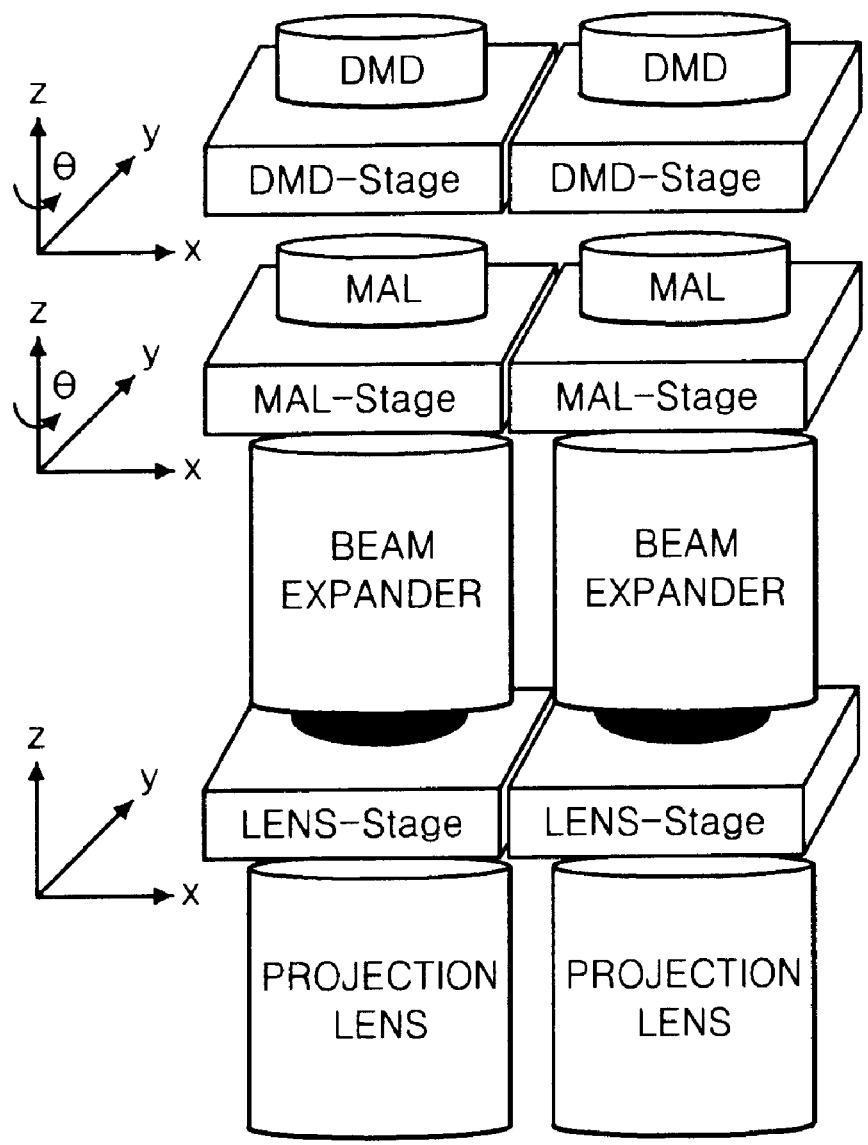
FIG. 27 is a schematic view illustrating a state that a driving stage is attached to the respective units to be corrected of the maskless exposure part.

FIG. 27 is a schematic view illustrating a state that a driving stage is attached to the respective units to be corrected of the maskless exposure part. Each of the DMD, the MAL and the projection lens is provided with a driving stage.

Therefore, in the present disclosure, the misalignment between the light of the first pattern of the DMD and the second pattern of the MRU can be corrected by driving the individual stage.

Figure 28:
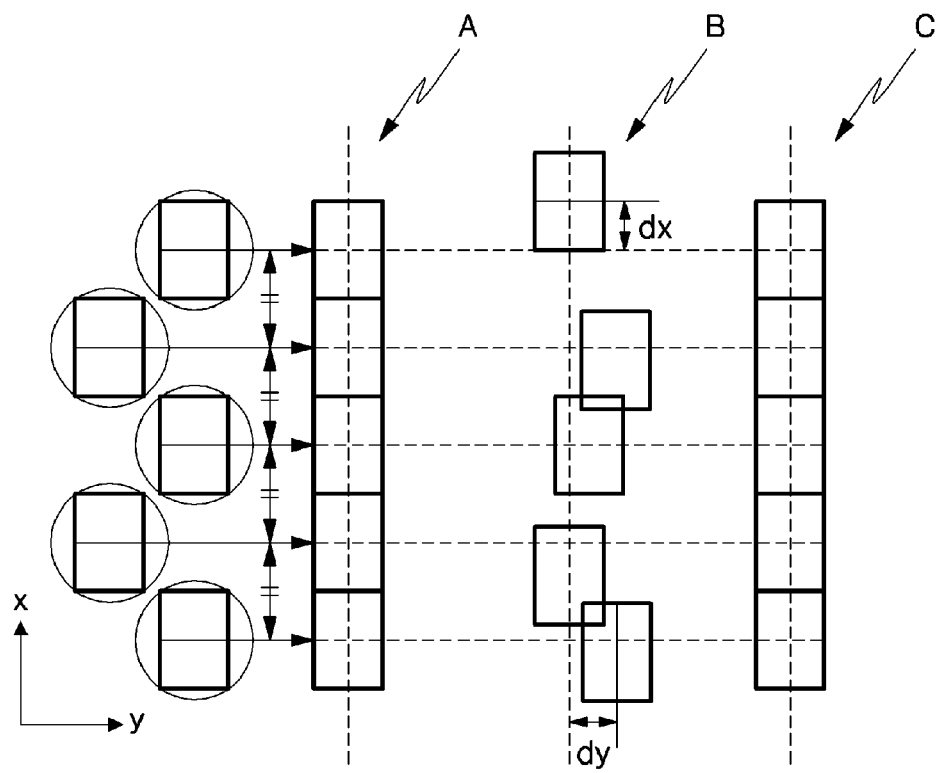
FIG. 28 is a view illustrating a method for correcting misarrangement of the projection lenses.
Figure 28:
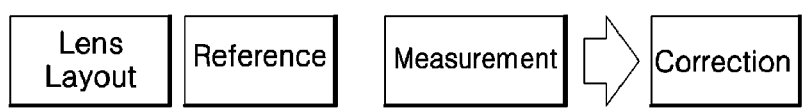

FIG. 28 is a view illustrating a method for correcting misarrangement of the projection lenses. In a case of using a plurality of projection lenses, optical axes of the projection lenses should be aligned by a predetermined reference.

However, in a case that the central axes of the projection lenses do not agree with one another by an influence such as aberration of the projection lens, the projection lenses are misarranged and thus a pattern defect is generated upon exposure.

At this time, when even one axis is deviated, the pattern is actually exposed in different position, and thus a positional error is generated in the pattern.

Therefore, in the present disclosure, a standard axis is set (state A), X-axes and Y-axes of the plurality of projection lenses are measured (state B) and then these are corrected (state C).

Figure 29:
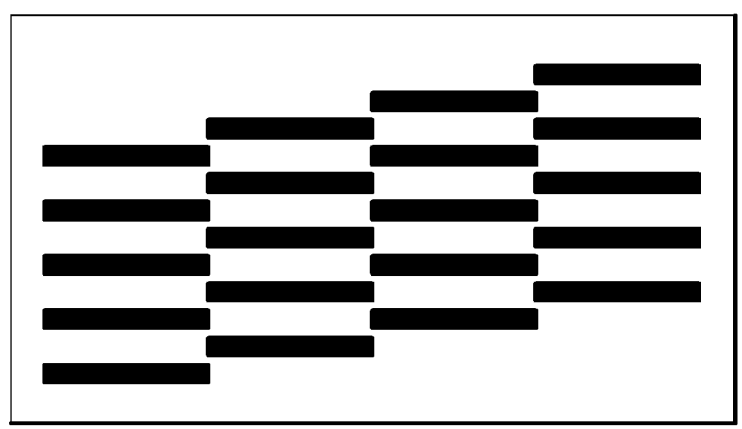
FIGS. 29 through 31 are views illustrating a method for correcting spaces between the Y-axes of the projection lenses.
Figure 30:
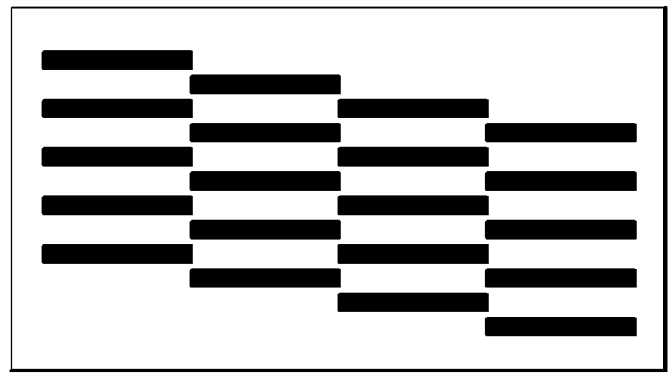
Figure 31:
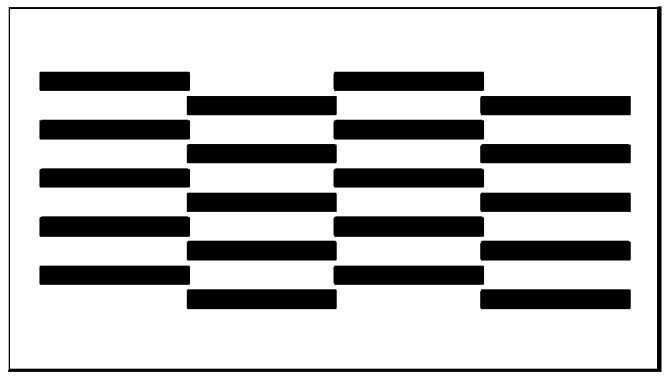

FIGS. 29 through 31 are views illustrating a method for correcting spaces between the Y-axes of the projection lenses. These figures show patterns exposed through a plurality of projection lenses.

In other words, the exposed patterns are deviated from one another and this is because the exposure process is performed in a state that individual central axis of the projection lens is deviated from the central axes of other projection lenses on Y-axis (scan axis) section.

Therefore, the patterns generated through exposure by the respective projection lenses deviated from one another are present in different positions from one another with respect to Y-axis direction.

Consequently, the pattern is represented as a blur in the whole exposed pattern region.

Therefore, in the present disclosure, the exposure is performed with lights having the same pattern which are projected from a plurality of projection lenses, positional error and angular error of the respective patterns are measured, and the Y-axis space between the projection lenses can be corrected on the basis of the measured error.

Figure 32:
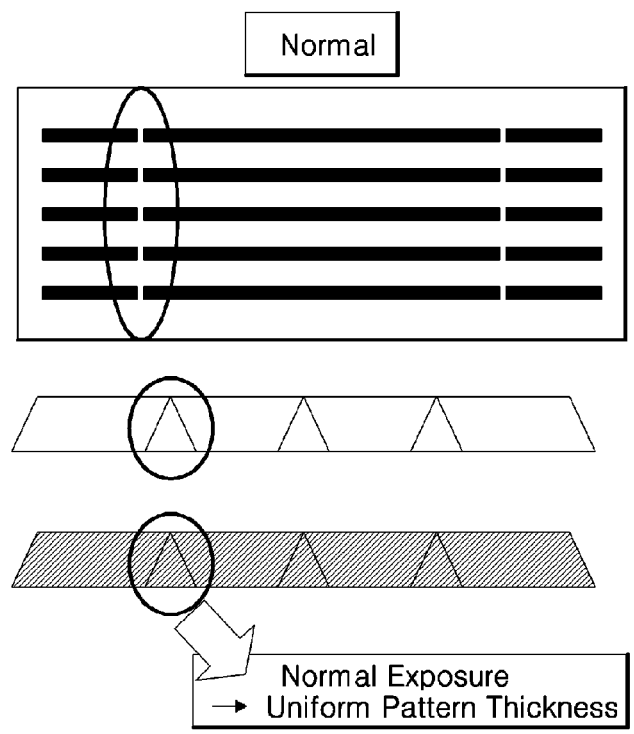
FIGS. 32 through 34 are views illustrating a state exposed by spaces between X-axes of the projection lenses according to the present disclosure.
Figure 33:
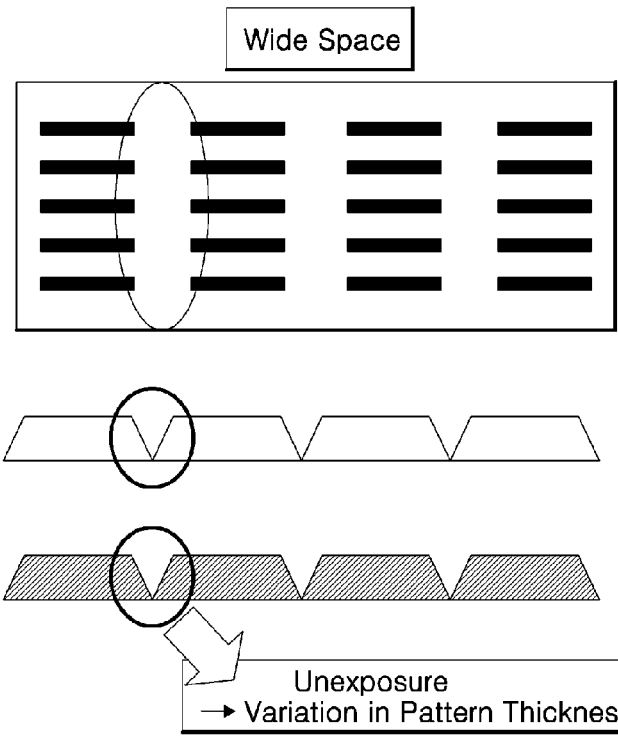

FIGS. 32 and 33 are views illustrating a state exposed by spaces between X-axes of the projection lenses according to the present disclosure. On an X-axis section which is perpendicular to the scan axis, a normal exposure pattern is formed when the central axes of the projection lenses agree with each other.

In other words, the thickness of the exposed pattern becomes uniform.

However, in a case that the central axes of the projection lenses are deviated from one another, the patterns generated through the exposure by the respective projection lenses are generated in different positions from one another with respect to X-axis direction.

Therefore, abnormal exposure pattern is formed and this is represented as a blur in the whole pattern region.

FIG. 33 shows the case that the space between the projection lenses is wide, and unexposed region which is not exposed is generated and the thickness of the pattern is varied.

Figure 34:
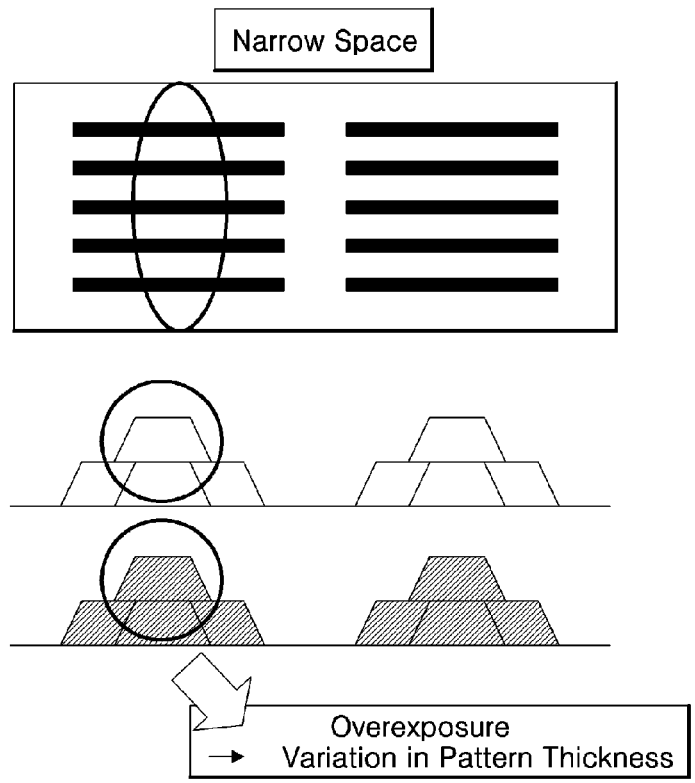

Also, FIG. 34 shows the case that the space between the projection lenses is narrow, and an overexposed region is generated and the thickness of the pattern is varied.

Consequently, when the space between the projection lenses is wider or narrower than the reference space, some has a space between the scans and thus is unexposed and some are overlapped and thus overexposed. Therefore, the quality of the exposed pattern is not uniform.

Therefore, in the present disclosure, a pair of the adjacent projection lenses project lights having the same patterns, one projection lens exposes a test region and then the other projection lens moved to the test region to expose the test region, a space error of an X-axis is obtained with amount of movement of the projection lens and difference between the centers of the exposed patterns, and then the X-axis space of the pair of the projection lenses is corrected with the obtained X-axis space error.

The maskless exposure method as described above is performed during a process of manufacturing a FPD panel.

In other words, in a method of manufacturing a FPD panel provided with an exposure process for forming repeated unit patterns, the exposure process is performed in a maskless exposure apparatus including a maskless exposure part for exposing a predetermined object with a light having a first pattern; a MRU formed with a second pattern that does not transmit the light having the first pattern; and a MRU camera for photographing a light transmitted through the MRU, and is further provided with, prior to or during the exposure process, in the maskless exposure part, a process in that the light of the first pattern is irradiated to the MRU formed with the second pattern that does not transmits the light having the first pattern and transmitting the light, the MRU camera photographs the light transmitted through the MRU, a misalignment error is calculated with the first and second patterns represented in an image photographed by the MRU camera, and the MAL or SLM is moved to correct the misalignment error.

As described above, the exposure process performed in the FPD panel including LCD panel and PDP can be performed in the maskless exposure apparatus and method.

Figure 35:
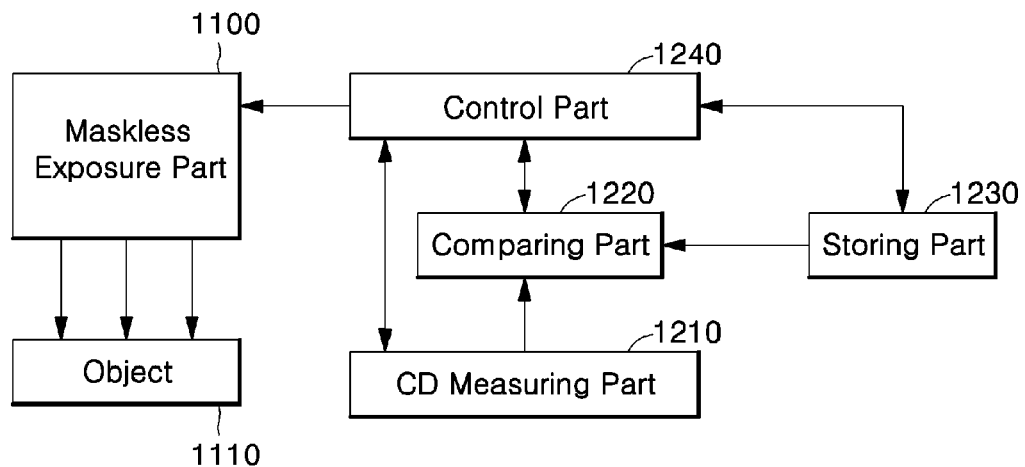
FIG. 35 is a schematic structural view illustrating a maskless exposure apparatus according to a second implementation of the present disclosure.

FIG. 35 is a schematic structural view illustrating a maskless exposure apparatus according to a second implementation of the present disclosure, which includes a maskless exposure part 1100 for exposing a predetermined object 1110 without a mask; a critical dimension measuring part 1210 for measuring a critical dimension (CD) of a pattern exposed on the object 1110; a storing part 1230 in which a standard CD range of the exposed pattern is previously stored; a comparing part 1220 for comparing the CD of the pattern measured by the CD measuring part 1210 with the reference CD range stored in the storing part 1230; and a control part 1240 which receives an output signal of the comparing part 1220 and outputs, when the measured CD of the pattern is out of the reference CD range, a control signal to the maskless exposure part to decrease a threshold light intensity of the maskless exposure part so that the CD of the exposed pattern is within the reference CD range.

The maskless exposure apparatus according to a second implementation of the present disclosure constituted as described above can measure the CD of the exposed pattern and correct the CD by decreasing the threshold light intensity so that the CD of the exposed pattern is within the reference CD range when the measured CD is out of the reference CD range.

Figure 36:
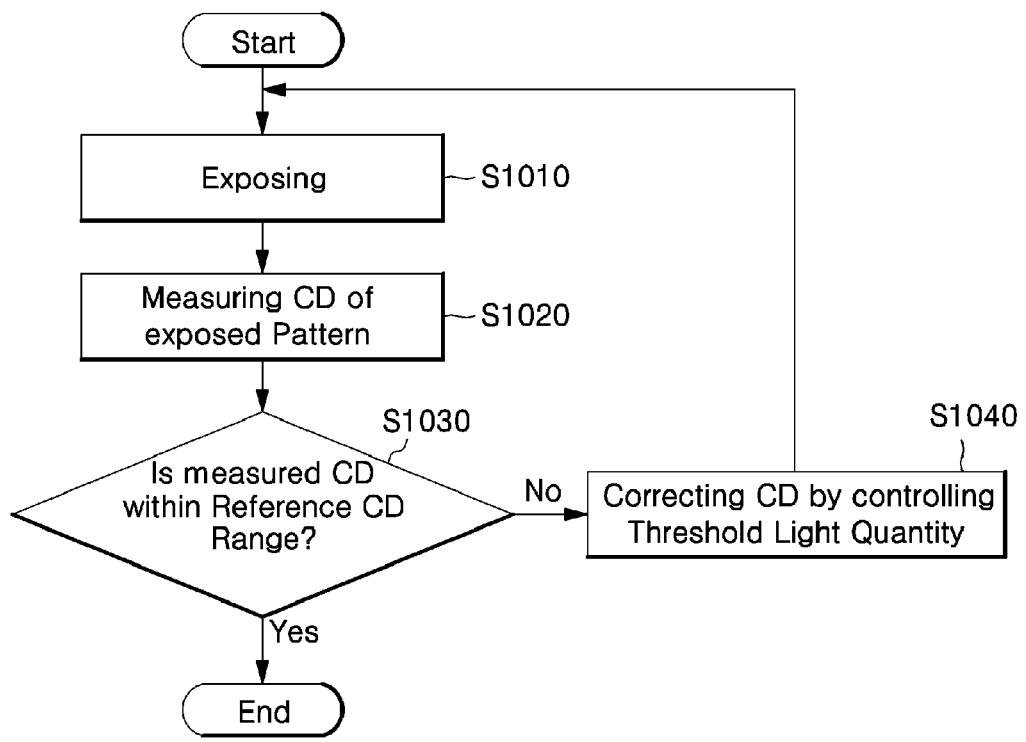
FIG. 36 is a flowchart illustrating a maskless exposure method according to a second implementation of the present disclosure.

FIG. 36 is a flowchart illustrating a maskless exposure method according to a second implementation of the present disclosure. The maskless exposure part exposes the predetermined object (Step S1010).

Successively, the CD of the pattern exposed on the object is measured (Step S1020).

Subsequently, whether the measured CD of the pattern is within the reference CD range is determined (Step S1030).

After that, when the measured CD of the pattern is out of the reference CD range, the threshold light intensity of the maskless exposure part is decreased to correct the CD (Step S1040).

When the measured CD of the pattern comes within the reference CD range, the process is ended.

Figure 37:
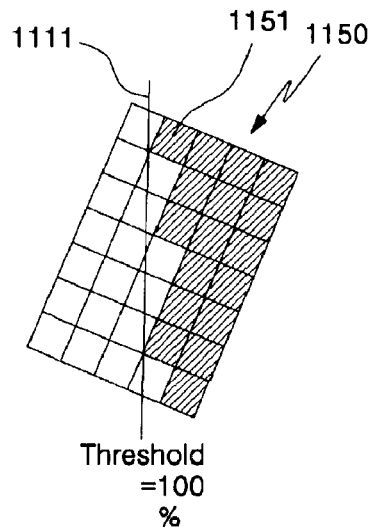
FIGS. 37 and 38 are schematic structural views of the maskless exposure apparatus of according to a second implementation of the present disclosure.
Figure 38:
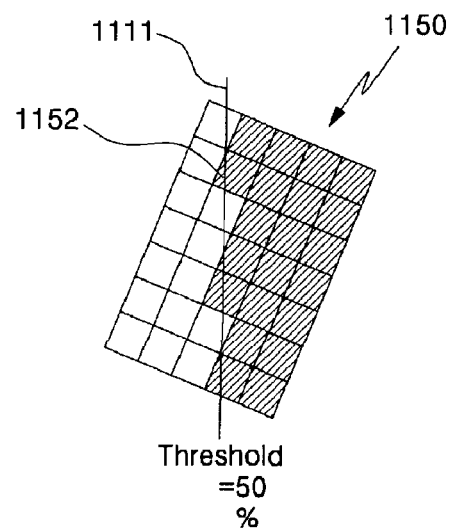

FIGS. 37 and 38 are schematic structural views of the maskless exposure apparatus of according to a second implementation of the present disclosure. The aforementioned threshold light quantity is an index for determining whether turning on the pixels according to a level that the pixels of the DMD are included within the target CD when forming the exposure pattern.

Also, the lower the threshold light intensity is set, the thicker the CD is obtained.

In other words, as shown in FIG. 37, when the threshold light intensity is 100%, pixels 1151 of the DMD 1150 in an inside of the perimeter 1111 of the pattern to be exposed are turned on. As shown in FIG. 38, when the threshold light intensity is 50%, pixels 1151 of the DMD 1150 out of the perimeter 1111 of the pattern to be exposed are also turned on.

Herein, in FIGS. 37 and 38, the pixels marked by a shadow are turned-on pixels.

Figure 39:
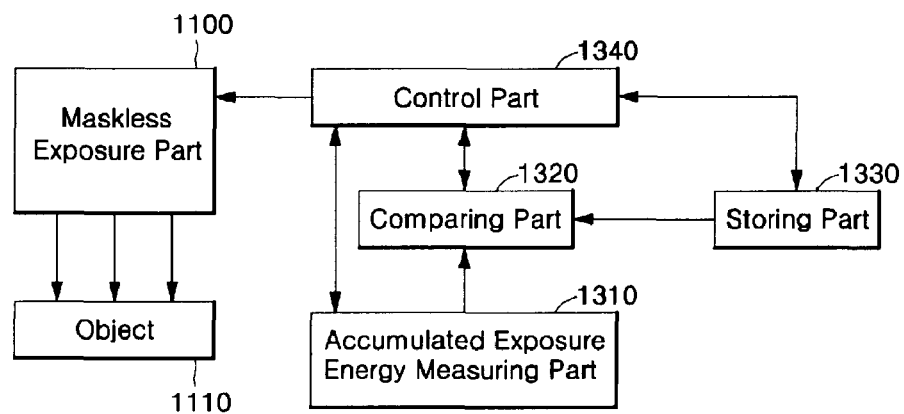
FIG. 39 is a schematic structural view illustrating a maskless exposure apparatus according to a third implementation of the present disclosure.

FIG. 39 is a schematic structural view illustrating a maskless exposure apparatus according to a third implementation of the present disclosure, which includes a maskless exposure part 1100 for projecting a pattern light formed by selective turning-on of pixels of a DMD to expose a predetermined object 1110; an accumulated exposure energy measuring part 1310 for measuring accumulated exposure energy of the maskless exposure part 1100; a storing part in which a reference accumulated exposure energy of the maskless exposure part 1100 is stored; a comparing part for comparing the accumulated exposure energy measured by the accumulated exposure energy measuring part 1310 with the reference accumulated exposure energy stored in the storing part; and a control part 1340 which, when the measured accumulated exposure energy is higher than the reference accumulated exposure energy, receives an output of the comparing part 1320 and turns off some of the turned-on pixels of the DMD so that the accumulated exposure energy of the maskless exposure part agrees with the reference accumulated exposure energy.

Therefore, the maskless exposure apparatus according to a third implementation of the present disclosure turns off, when the accumulated exposure energy of the exposure part is higher than the reference accumulated exposure energy, some of the pixels of the DMD to make the accumulated exposure energy of the exposure part to be agreed with the reference accumulated exposure energy, thereby reducing generation of a blur of the exposed pattern.

Figure 40:
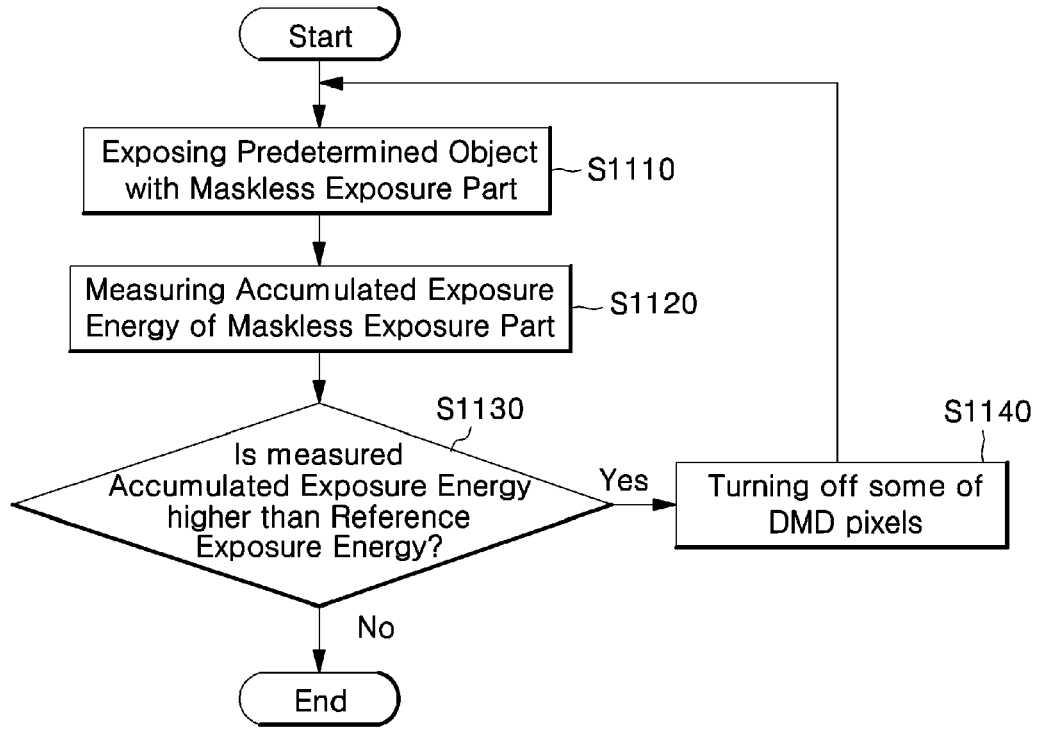
FIG. 40 is a flowchart illustrating a maskless exposure method according to a third implementation of the present disclosure.

FIG. 40 is a flowchart illustrating a maskless exposure method according to a third implementation of the present disclosure. The pattern light formed by selective turning-on of the pixels of the DMD is projected from the maskless exposure part to expose the predetermined object (Step S1110).

Herein, it is preferable that the maskless exposure part exposes the object while scanning the object in one direction.

Next, the accumulated exposure energy of the maskless exposure part is measured (Step S1120).

After that, whether the measured accumulated exposure energy is higher than the reference exposure energy is determined (Step S1130).

Subsequently, when the measured accumulated exposure energy is higher than the reference accumulated exposure energy, some of the turned-on pixels of the DMD are turned off to make the accumulated exposure energy of the maskless exposure part to agree with the reference accumulated exposure energy (Step S1140).

Herein, in the measurement of the accumulated exposure energy, it is preferable that the exposed object region is divided into a plurality of regions and the accumulated exposure energy is measured in the respective divided regions.

Also, in the determining whether the measured accumulated exposure energy is higher than the reference exposure energy, it is preferable that the accumulated exposure energy measured in the respective divided regions is higher than the reference accumulated exposure energy.

When the measured accumulated exposure energy is higher than the reference exposure energy, some of the turned-on pixels of the DMD which exposes the divided regions are turned off to make the accumulated exposure energy of the maskless exposure part to agree with the reference exposure energy.

Also, it is preferable that each of the divided regions one of the turned-on pixels of the DMD and, when the measured accumulated exposure energy is higher than the reference accumulated exposure energy, the turned-on pixel of the DMD which exposes the respective divided regions is turned off to make the accumulated exposure energy of the maskless exposure part to agree with the reference accumulated exposure energy.

As described above, the maskless exposure method according to a third implementation of the present disclosure forcibly turns off the pixels having the accumulated exposure energy higher than the reference value and thus distributes uniformly the accumulated exposure energy of the maskless exposure part.

Figure 41:
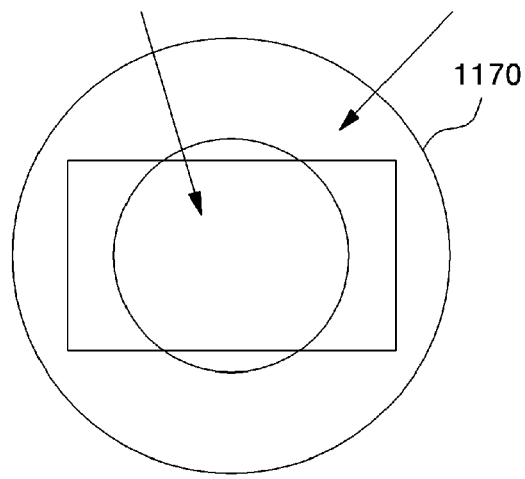
FIG. 41 is a view illustrating the accumulated exposure energy in the projection lens of the maskless exposure part according to the present disclosure.

FIG. 41 is a view illustrating the accumulated exposure energy in the projection lens of the maskless exposure part according to the present disclosure. In the maskless exposure part, while passing through the projection lens, energy of the light source is high at the center of the projection lens 1170 and low at the outer portion of the projection lens 1170.

Accordingly, in a case that the maskless exposure part exposes in one direction, the accumulated exposure energy is different from position to position.

Therefore, in the third implementation of the present disclosure, when the measured accumulated exposure energy is higher than the reference exposure energy, it is possible to control the energy difference by turning off some of the turned-on pixels of the DMD and thus making the accumulated exposure energy of the maskless exposure part to agree with the reference exposure energy.

Figure 42:
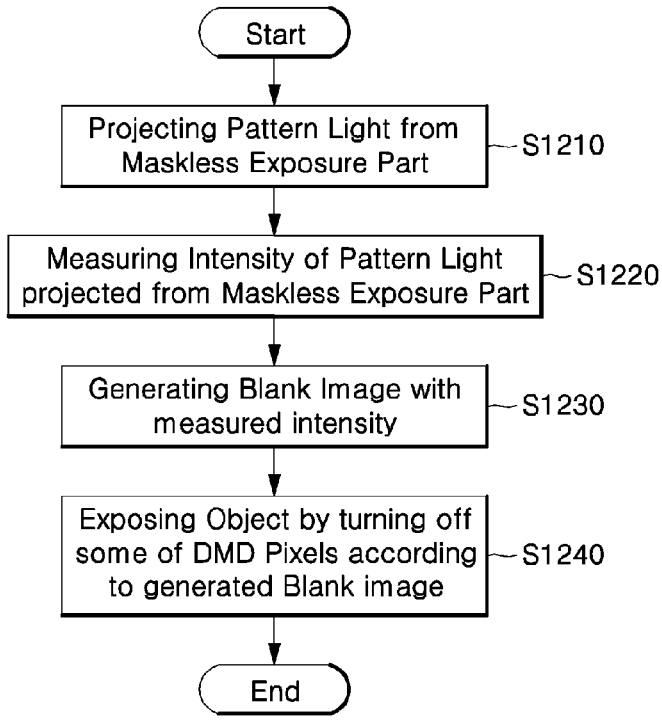
FIG. 42 is a flowchart of a maskless exposure method according to a fourth implementation of the present disclosure.

FIG. 42 is a flowchart of a maskless exposure method according to a fourth implementation of the present disclosure. A pattern light formed by selective turning on of the pixels of the DMD is projected from the maskless exposure part (Step S1210).

Next, intensity of the pattern light projected from the maskless exposure part is measured (Step S1220).

Subsequently, with the measured light intensity, a blank image that can turn off some of the pixels of the DMD is generated (Step S1230).

After that, some of the turned-on pixels of the DMD are turned off according to the blank image and the maskless exposure part exposes a predetermined object (Step S1240).

When the maskless exposure parts are arranged in plural, it is possible to raise the light intensity at the boundary portions of the respective scan regions and thus reduce generation of the blur in the exposed pattern by overlapping the blank images at the boundary portions of the respective scan regions and exposing the blank images with the respective maskless exposure parts.

Figure 43:
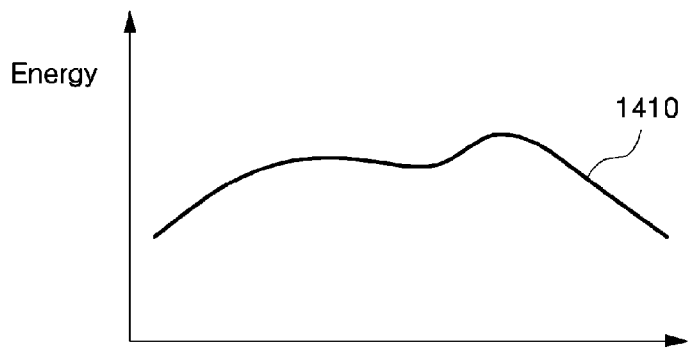
FIGS. 43 through 45 are graphs illustrating that energy of the original pattern light becomes uniform by a blank image generated according to a fourth implementation of the present disclosure.
Figure 44:
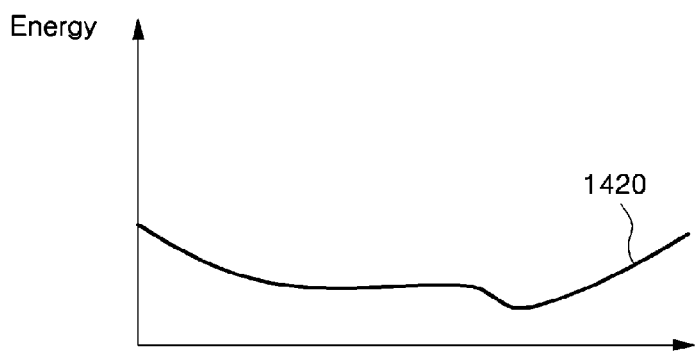
Figure 45:

FIGS. 43 through 45 are graphs illustrating that energy of the original pattern light becomes uniform by the blank image generated according to a fourth implementation of the present disclosure. As shown FIG. 43, energy distribution 1410 of the pattern light projected from the maskless exposure part is not uniform.

Therefore, as described above, the intensity of the pattern light projected from the maskless exposure part is measured and a blank image that can turn off some of the turned-on pixels of the DMD is generated with the measured intensity, and FIG. 44 shows energy distribution 1420 of the blank image.

Consequently, by turning off some of the turned-on pixels of the DMD according to the blank image, the energy distribution 1430 becomes uniform as shown in FIG. 45. Therefore, it is possible to remove the intensity deviation and reduce the generation of the blur in the exposed pattern.

Figure 46:
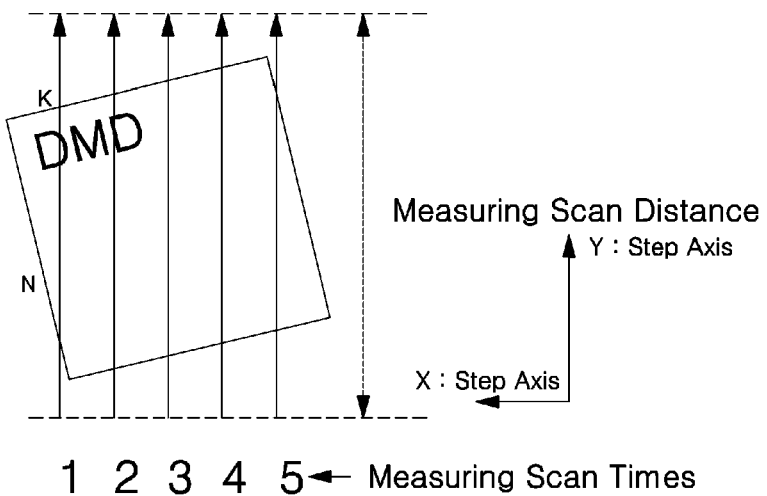
FIGS. 46 and 47 are views illustrating generation of the blank image according to a fourth implementation of the present disclosure.
Figure 47:
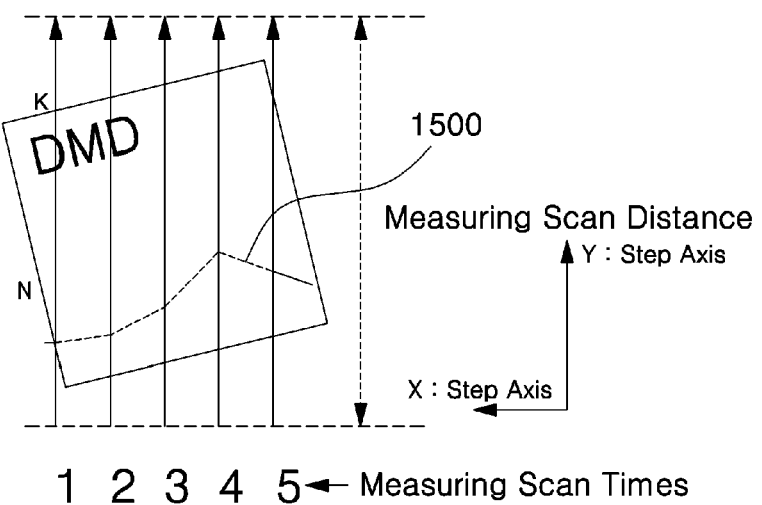

FIGS. 46 and 47 are views illustrating generation of the blank image according to a fourth implementation of the present disclosure. In order to generate the blank image, as shown in FIG. 46, a target light quantity is set and a light intensity is measured while scanning along the Y axis. By the measured light intensity, the blank image such as '1500' in FIG. 47 can be generated.

Describing the generation of the blank image, intensity values scanned from position to position are defined as Index$_{(i)}$, and Index$_{(i)}$ is represented by Index$_{(i)}$ (mm/mJ)=resolution (mm)/initial accumulated light quantity (mJ)×actually scanned pixel.

At this time, when defining the intensity deviation as a delintensity, the measured intensity as a dataintensity$_{(i)}$, and a reference intensity as a dataintensity$_{min=target}$, delintensity is represented by delintensity=dataintensity$_{(i)}$−dataintensity$_{min=target}$.

Also, a masking distance is represented by delintensity×Index$_{(i)}$.

Further, masking pixels which are the pixels of the DMD to be turned off in the corresponding region are represented by masking distance×resolution.

Therefore, X coordinate represents a measuring position and Y coordinate represents the masking pixel, thereby capable of generating the blank image.

The maskless exposure method of the present disclosure as described above is performed during the process of manufacturing a FPD panel.

In other words, in a method of manufacturing a FPD panel provided with an exposure process for forming a repeated unit pattern, the exposure process further includes one of a process of correcting the CD of the exposed pattern by decreasing the threshold light quantity, a process of making the accumulated exposure energy to agree with the reference exposure energy, and a process of making an energy distribution for an exposure to be uniform with a blank image having an energy distribution which is opposite to the energy distribution for an exposure.

Herein, it is preferable that the exposure process is performed in the maskless exposure part which exposes by projecting a pattern light formed by selective turning-on of the pixels of the DMD, and the process of making the accumulated exposure energy to agree with the reference exposure energy is performed by turning off some of the turned-on pixels of the DMD.

Also, the blank image is an image capable of turning off some of the turned-on pixels of the DMD.

As described above, the exposure process performed in the FPD panel including LCD panel and PDP can be performed in the maskless exposure apparatus and method.

Figure 48:
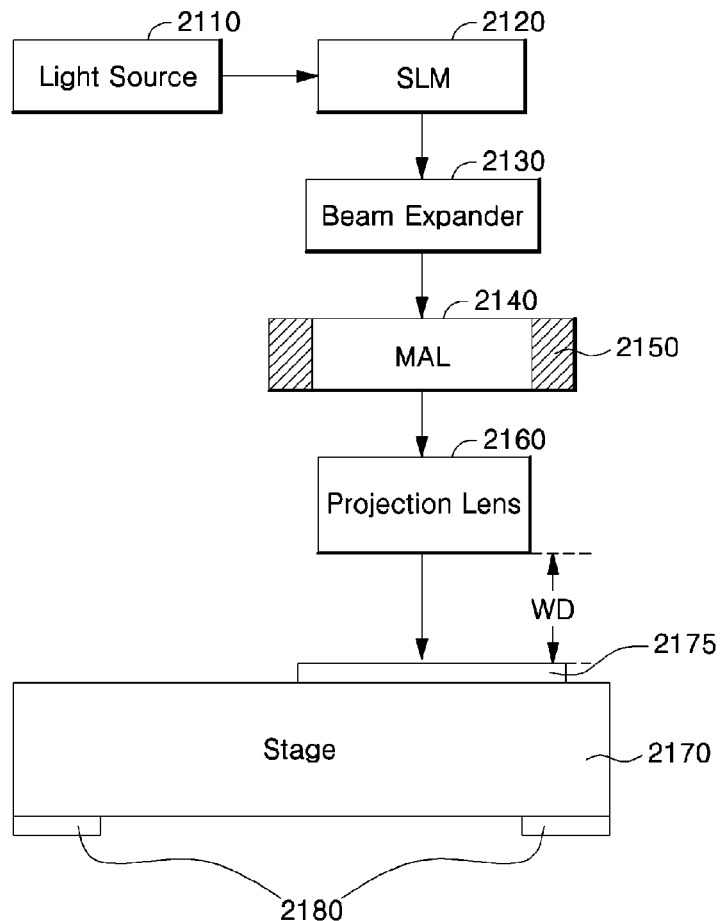
FIG. 48 is a schematic structural view illustrating a maskless exposure apparatus according to a fifth implementation of the present disclosure.

FIG. 48 is a schematic structural view illustrating a maskless exposure apparatus according to a fifth implementation of the present disclosure, which includes a light source 2110 for projecting a light; a SLM 2120 for reflecting the light projected from the light source 2110 as a light having a pattern; a beam expander 2130 for expanding the light projected from the SLM 2120; a MAL 2140 arrayed with a plurality of lenses so as to divide the light expanded in the beam expander 2130 into a plurality of lights and collects the divided lights; a projection lens 2160 for controlling resolutions of the lights collected by the MAL 2140 and transmitting the resultant lights to the object 2175; an actuator 2150 for driving the MAL 2140 along Z-axis to preliminarily adjust a working distance WD between the projection lens 2160 and the object 2175; and a stage 2170 on which the object is laid and which is provided with a leveling motor 2180 for secondarily adjusting the working distance between the projection lens 2160 and the object 2175.

Herein, it is preferable that an auto-focus sensor for measuring the working distance between the projection lens 2160 and the object 2175 is further provided.

In other words, the auto-focus sensor senses whether the working distance is placed within a depth of focus (DOF).

The auto-focus sensor can measure the working distance with laser, infra red ray, supersonic wave and so on and also can measure visually the working distance using a CCD.

Figure 49:
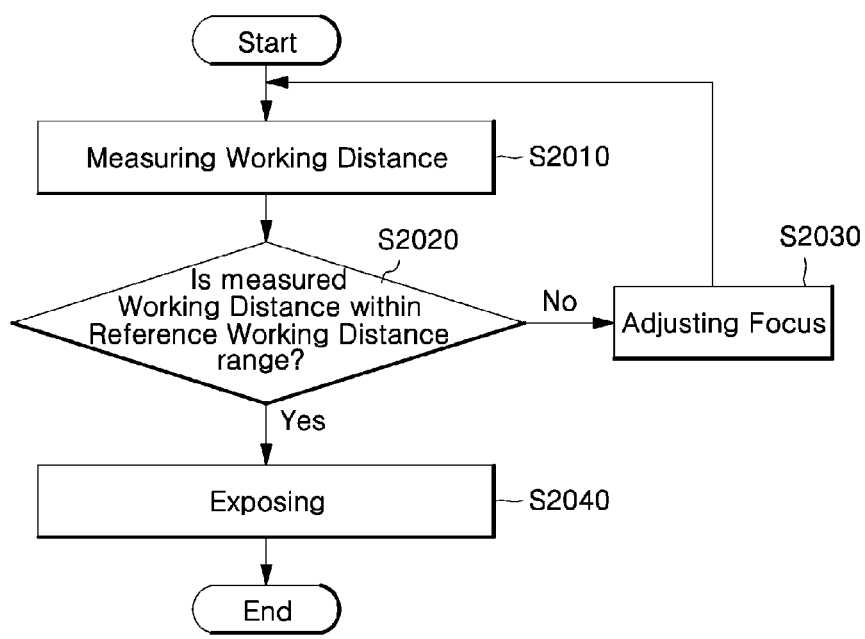
FIG. 49 is a flowchart illustrating the maskless exposure method according to a fifth implementation of the present disclosure.

FIG. 49 is a flowchart illustrating the maskless exposure method according to a fifth implementation of the present disclosure. A working distance between the maskless exposure part provided with the MAL and the object is measured (Step S2010).

After that, whether the measured working distance is within a reference working distance is determined (Step S2020).

Subsequently, when the measured working distance is not within a reference working distance, the MAL alone of the maskless exposure part is moved to adjust the focus (Step S2030).

Subsequently, when the measured working distance is within a reference working distance, the maskless exposure part exposes the object (Step S2040).

Figure 50:
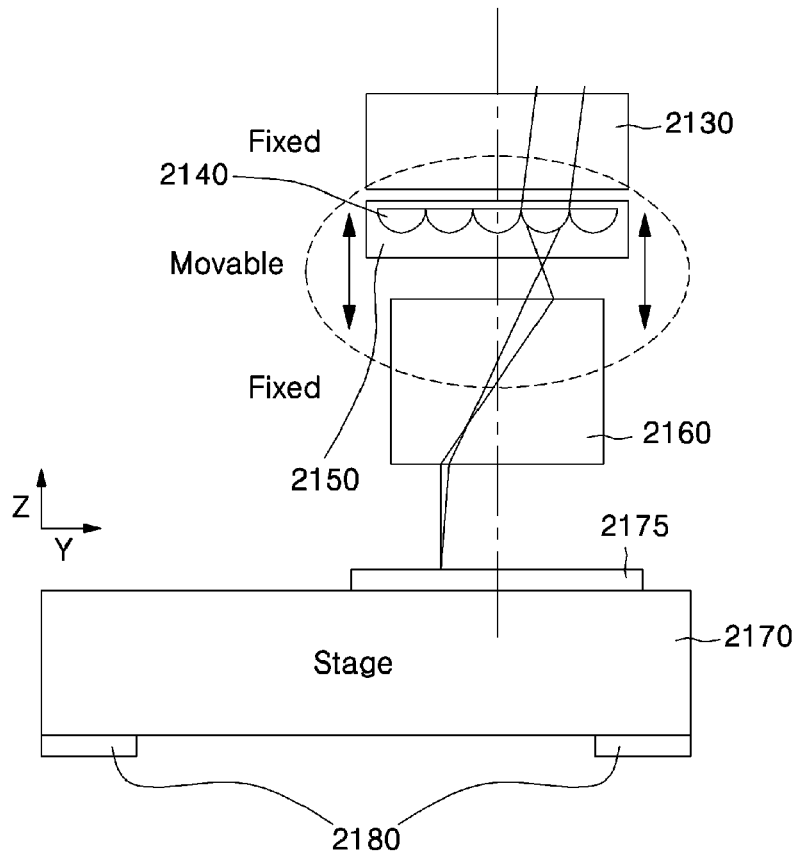
FIG. 50 is a schematic view illustrating focus adjustment in the maskless exposure apparatus according to a fifth implementation of the present disclosure.

FIG. 50 is a schematic view illustrating focus adjustment in the maskless exposure apparatus according to a fifth implementation of the present disclosure. In the present disclosure, the beam expander 2130 and the projection lens 2160 are fixed and the actuator 2150 for moving the MAL 2140 along the Z-axis is driven to adjust the focus of the maskless exposure part.

At this time, since the MAL 2140 should be moved on a per nanometer basis, a precise actuator such as a piezo-actuator or a voice coil motor is used.

At this time, in a conventional exposure apparatus, since the focus is adjusted by moving up and down the whole projection lens or by moving up and down a specific lens capable of adjusting the focus, there is problems that an error may be generated in fine adjustment of the very precise projection lenses and an interference with adjacent exposure part may be generated when the exposure apparatus is constituted of a plurality of maskless exposure parts.

Therefore, in the present disclosure, there is an advantage that it is possible to prevent the mechanical interference even when a plurality of the maskless exposure parts are arrayed since the focus is adjusted by moving the MAL along the Z-axis.

Figure 51:
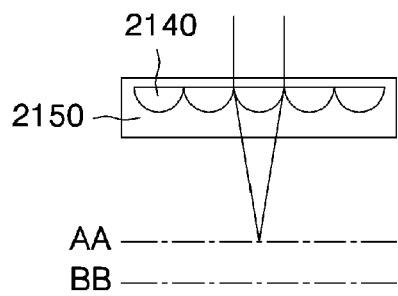
FIGS. 51 and 52 are views illustrating change of the focus by movement of the MAL according to a fifth implementation of the present disclosure.
Figure 52:
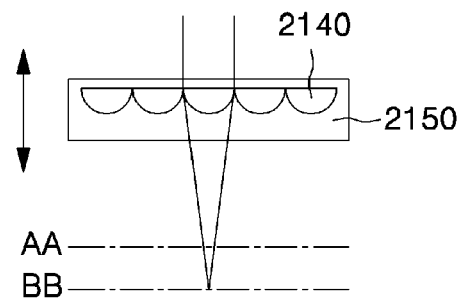

FIGS. 51 and 52 are views illustrating change of the focus by movement of the MAL according to a fifth implementation of the present disclosure. When the focus of the MAL 2140 is laid on a line 'AA' as shown in FIG. 50, the focus is laid on a line 'BB' which is below the line 'AA' if the MAL 2140 is moved down in the Z-axis direction as shown in FIG. 51.

Therefore, the focus is changed as the MAL 2140 is moved up and down in the Z-axis direction.

Figure 53:
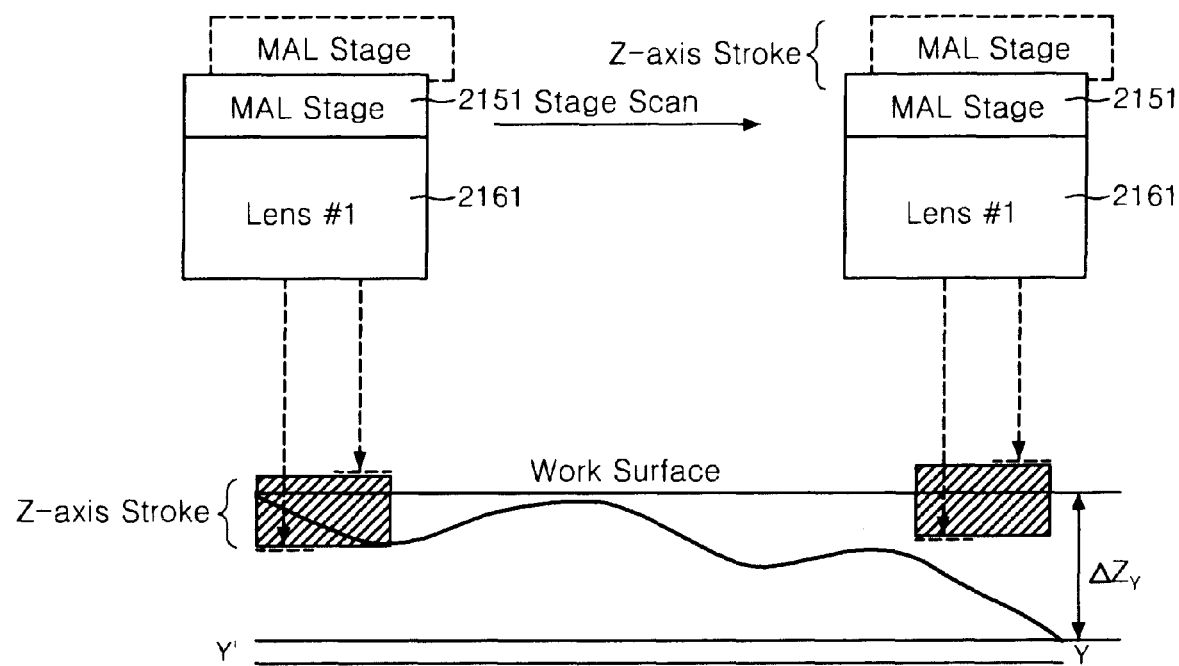
FIG. 53 is a view illustrating a surface condition of the object varied as the maskless exposure part scans the object according to a fifth implementation of the present disclosure.

FIG. 53 is a view illustrating a surface condition of the object varied as the maskless exposure part scans the object according to a fifth implementation of the present disclosure. The maskless exposure part is provided with a projection lens 2161.

In an initial state before this maskless exposure part scans, a work surface of the object is present within a range of a Z-axis stroke of the projection lens 2161, but the working surface of the object is present out of the range of a Z-axis stroke of the projection lens 2161 as goes to the latter of the scanning.

In this case, since it is impossible to set the focus only with the MAL stage 2151, i.e. an actuator for driving the MAL in the Z-axis, driving of the stage leveling motor mounted in the stage is necessary to set the work surface within the Z-axis stroke of the projection lens 2161.

Therefore, in order to set the auto-focus, the MAL stage 2151 performs micro-driving and the stage leveling motor performs macro-driving.

Figure 54:
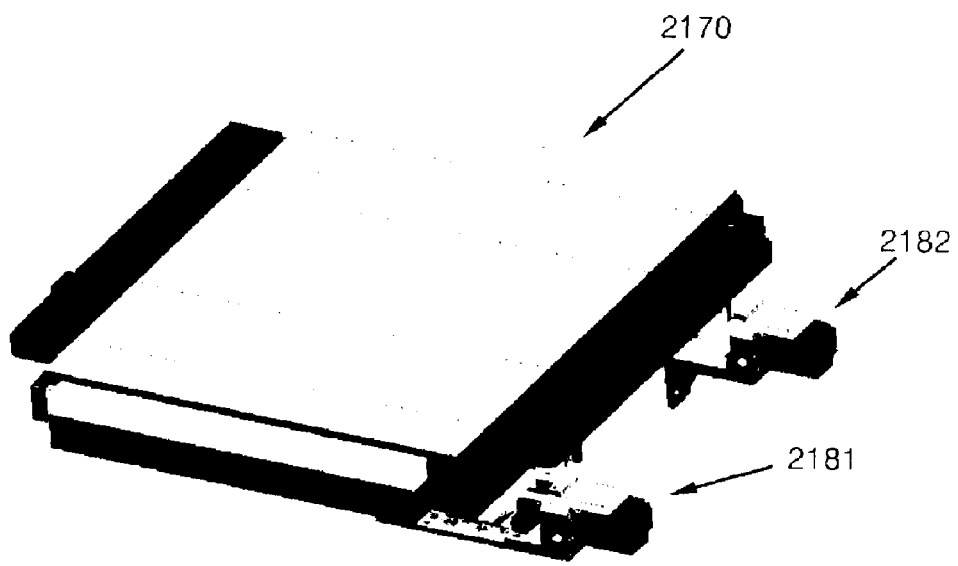
FIG. 54 is a perspective view illustrating a stage of the maskless exposure apparatus according to the present disclosure.

Consequently, as shown in FIG. 54, three stage leveling motors are mounted in the stage 2170 and a plane is controlled by the three stage leveling motors.

For reference, two stage leveling motors 2181 and 2182 are shown in FIG. 54.

Figure 55:
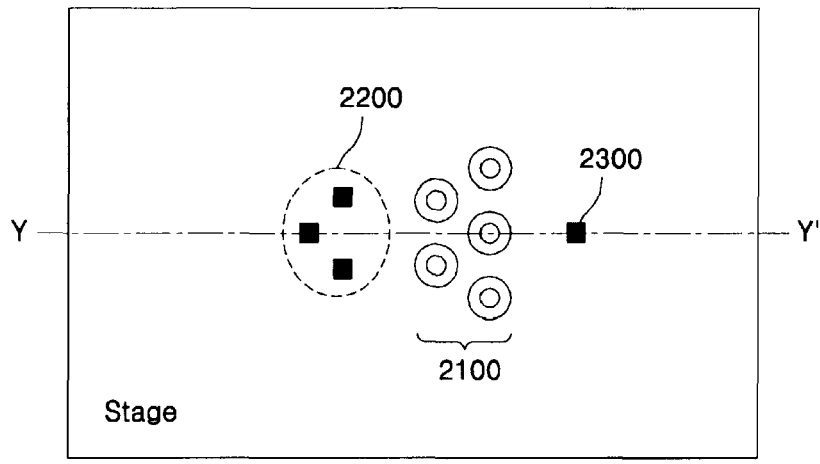
FIG. 55 is a schematic structural view illustrating a maskless exposure apparatus according to a sixth implementation of the present disclosure.

FIG. 55 is a schematic structural view illustrating a maskless exposure apparatus according to a sixth implementation of the present disclosure, which includes a plurality of maskless exposure parts 2100 for exposing a predetermined object without a mask; front auto-focus sensors 2200 placed at the front of the plurality of the maskless exposure parts 2100 so as to measure a working distance between the maskless exposure parts 2100 and the object; and rear auto-focus sensors 2300 placed at the rear of the plurality of the maskless exposure parts 2100 so as to measure the working distance between the maskless exposure parts 2100 and the object.

Herein, the object is laid on the stage and the stage is provided with a stage leveling motor for adjusting the working distance between the maskless exposure parts 2100 and the object.

Also, the front auto-focus sensors 2200 include at least three thereof so as to measure a Z-axis displacement of the maskless exposure parts 2100 and a reference plane driven with the stage leveling motor at the same time.

Further, since the stage leveling motor is driven with respect to the front when using the front auto-focus sensors 220, the working distance may be out of the depth of focus at the position of the rear auto-focus sensors 2300 with respect to the projection lenses. Therefore, the rear auto-focus sensors 2300 used to monitor and prevent the aforementioned phenomenon.

Figure 56:
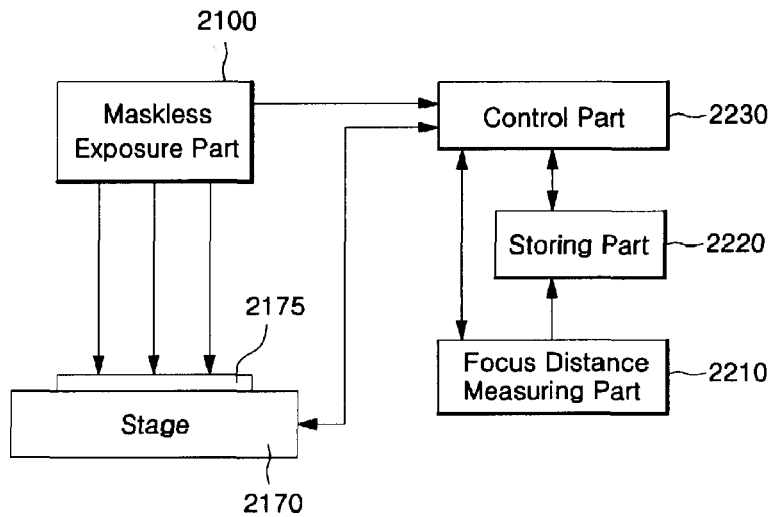
FIG. 56 is a schematic structural view illustrating a maskless exposure apparatus according to a seventh implementation of the present disclosure.

FIG. 56 is a schematic structural view illustrating a maskless exposure apparatus according to a seventh implementation of the present disclosure, which includes a stage 2170 on which a predetermined object 2175 is laid; a maskless exposure part 2100 for exposing the object 2175 without a mask; a focus distance measuring part 2210 for measuring a focus distance of the maskless exposure part 2100; a storing part 2220 for storing the focus distance measured by the focus distance measuring part 2210; and a control part 2230 for outputting a control signal for moving the maskless exposure part 2100 and the stage 2170 so as to maintain the focus distance stored in the storing part 2220

Herein, the focus distance refers to a distance in which the maskless exposure part 2100 can form an optimum focus to the object 2175.

In the maskless exposure apparatus according to a seventh implementation of the present disclosure constituted as described above, the focus distance measuring part 2210 measures a focus distance of the maskless exposure part 2100, this measured focus distance is stored in the storing part 2220, and the control part 2230 outputs a control signal and moves the maskless exposure part 2100 and the stage 2170 to focus so that the focus distance stored in the storing part 2220 can be maintained between the maskless exposure part 2100 and the object 2175.

Figure 57:
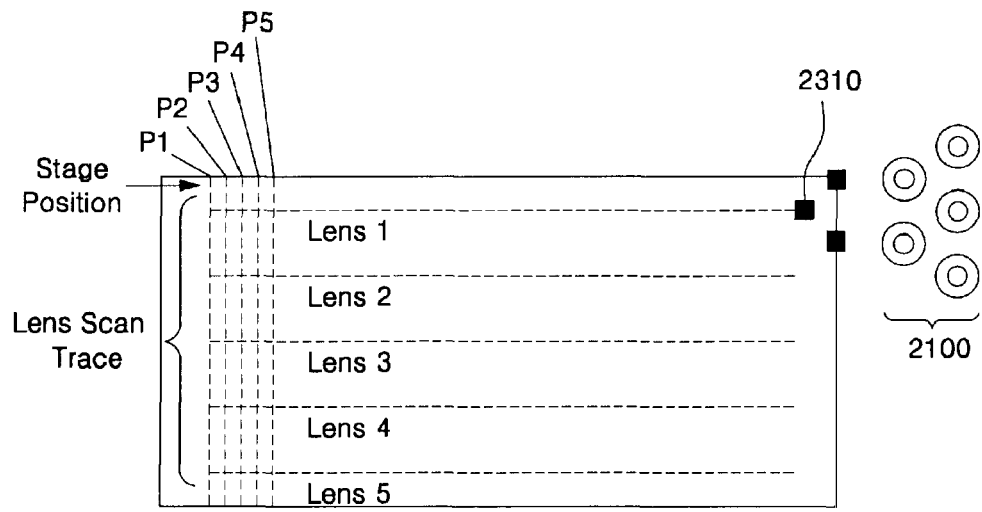
FIG. 57 is a schematic structural view illustrating a maskless exposure apparatus according to a seventh implementation of the present disclosure.

FIG. 57 is a schematic structural view illustrating a maskless exposure apparatus according to a seventh implementation of the present disclosure.

As the focus distance measuring part 2210 shown in FIG. 56, a position mapping sensor 2310 that subdivides a trace of the stage scanned by the respective maskless exposure parts into a plurality of positions and measures the focus distance at each of the plurality of the subdivided positions is preferred.

This mapping sensor 2310 may be realized one of the aforementioned front auto-focus sensors.

Therefore, the focus distance measured at each of the plurality of the subdivided positions is shown in Table 1.

At this time, since the respective maskless exposure parts are provided with a projection lens, FIG. 57 and the Table 1 will show and denote the maskless exposure parts as the projection lenses.

Therefore, the focus distance is measured at the respective subdivided positions P1.about.P5 of the trace of the stage scanned at the respective projection lenses Lens 1.about.Lens5 and shown in Table 1.

In other words, the focus distance at the position 'P1' of the first projection lens Lens1 is 'LP1-1' and the focus distance at the position 'P2' of the second projection lens Lens2 is 'LP2-2'.

TABLE 1

|    | Lens1  | Lens2  | Lens3  | Lens4  | Lens5  |
|----|--------|--------|--------|--------|--------|
| P1 | LP1-1  | LP2-1  | LP3-1  | LP4-1  | LP5-1  |
| P2 | LP1-2  | LP2-2  | LP3-2  | LP4-2  | LP5-2  |

TABLE 1-continued

|    | Lens1  | Lens2  | Lens3  | Lens4  | Lens5  |
|----|--------|--------|--------|--------|--------|
| P3 | LP1-3  | LP2-3  | LP3-3  | LP4-3  | LP5-3  |
| P4 | LP1-4  | LP2-4  | LP3-4  | LP4-4  | LP5-4  |
| P5 | LP1-5  | LP2-5  | LP3-5  | LP4-5  | LP5-5  |
| ...| ...    | ...    | ...    | ...    | ...    |

Figure 58:
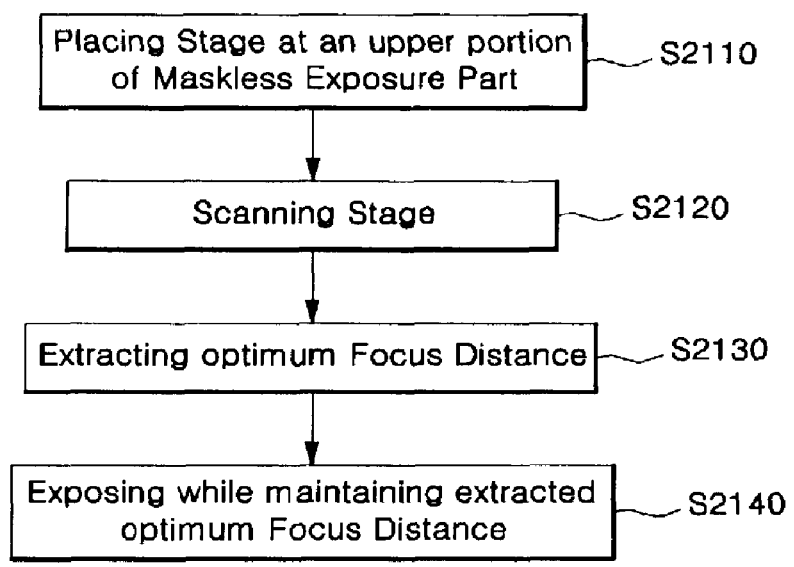
FIG. 58 is a flowchart illustrating a maskless exposure method according to a seventh implementation of the present disclosure.

FIG. 58 is a flowchart illustrating a maskless exposure method according to a seventh implementation of the present disclosure. First, the stage on which the object to be exposed can be laid is placed at a lower portion of the maskless exposure part (Step S2110).

Next, the maskless exposure parts scan the stage (Step S2120).

After that, each of the maskless exposure parts subdivides the scanned trace of the stage into a plurality of positions and extracts optimum focus distance of the respective maskless exposure parts at the plurality of subdivided positions (Step S2140).

Subsequently, the object to be exposed is laid on the stage (Step S2140).

After that, the maskless exposure parts expose the object while maintaining the optimum focus distance extracted at the plurality of the subdivided positions (Step S2150).

The object is laid on an upper portion of the stage provided with the stage leveling motors, the step of exposing the object with the maskless exposure parts while maintaining the extracted optimum focus distance is preferably a step of exposing the object with the maskless exposure parts while maintaining the extracted optimum focus distance by driving the stage leveling motors.

Figure 59:
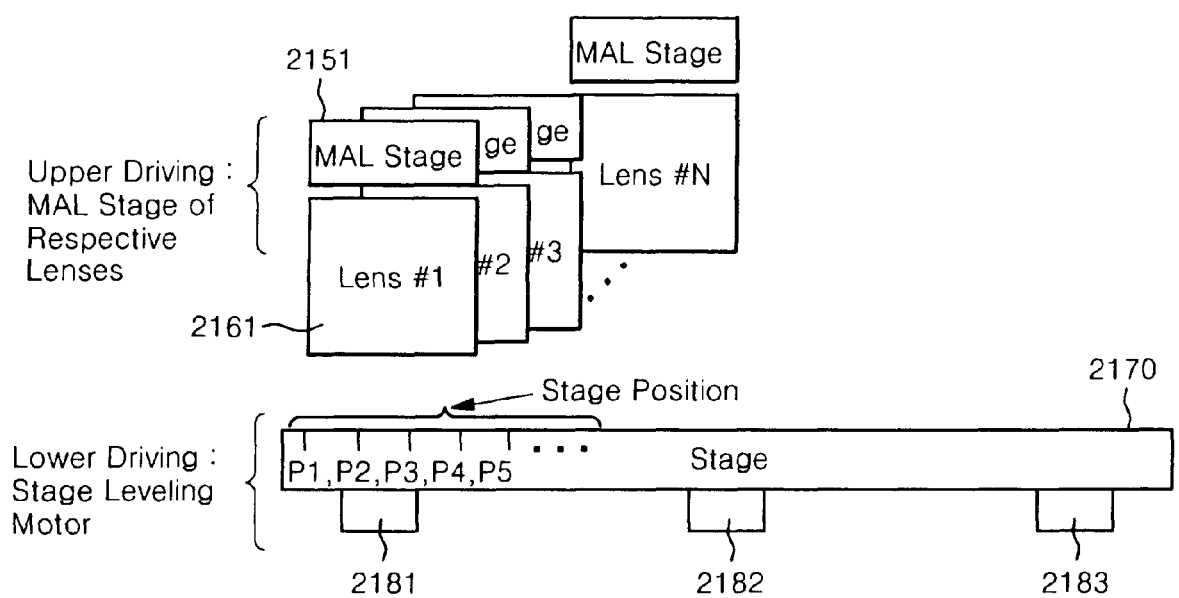
FIG. 59 is a view illustrating focus adjustment of the maskless exposure apparatus according to a seventh implementation of the present disclosure.

FIG. 59 is a view illustrating focus adjustment of the maskless exposure apparatus according to a seventh implementation of the present disclosure. As described above, in order to extracted focus distance, adjustment of the maskless exposure part is performed by micro-driving only with the MAL stage 2151, i.e. an actuator which drives the MAL along the Z-axis and macro-driving with the stage leveling motors 2181, 2182 and 2183 provided in the stage 2170 on which the object is laid.

In other words, the maskless exposure part includes a light source for projecting a light; a SLM for reflecting the light projected from the light source as a light having a pattern; a beam expander for expanding the light projected from the SLM; a MAL in which a plurality of lenses is arrayed to divide the light expanded in the beam expander into a plurality of lights and collects the divided lights; and a projection lens for controlling resolutions of the lights collected by the MAL and transmitting the resultant lights to the object.

The maskless exposure method of the present disclosure as described above is performed during the process of manufacturing a FPD panel.

Therefore, in a method of manufacturing a FPD panel provided with an exposure process for forming repeated unit patterns, the exposure process includes a process of measuring the working distance between the maskless exposure part and the object and adjusting the focus by moving the MAL of the maskless exposure part alone when the measured working distance is not within the range of the reference working distance or a process of scanning the stage with the maskless exposure part, extracting the focus distance of the maskless exposure part at the subdivided positions of the scanned trace and exposing while maintaining the focus distance extracted at the subdivided positions.

As described above, the exposure process performed in the FPD panel including LCD panel and PDP can be performed in the maskless exposure apparatus and method.

Figure 60:
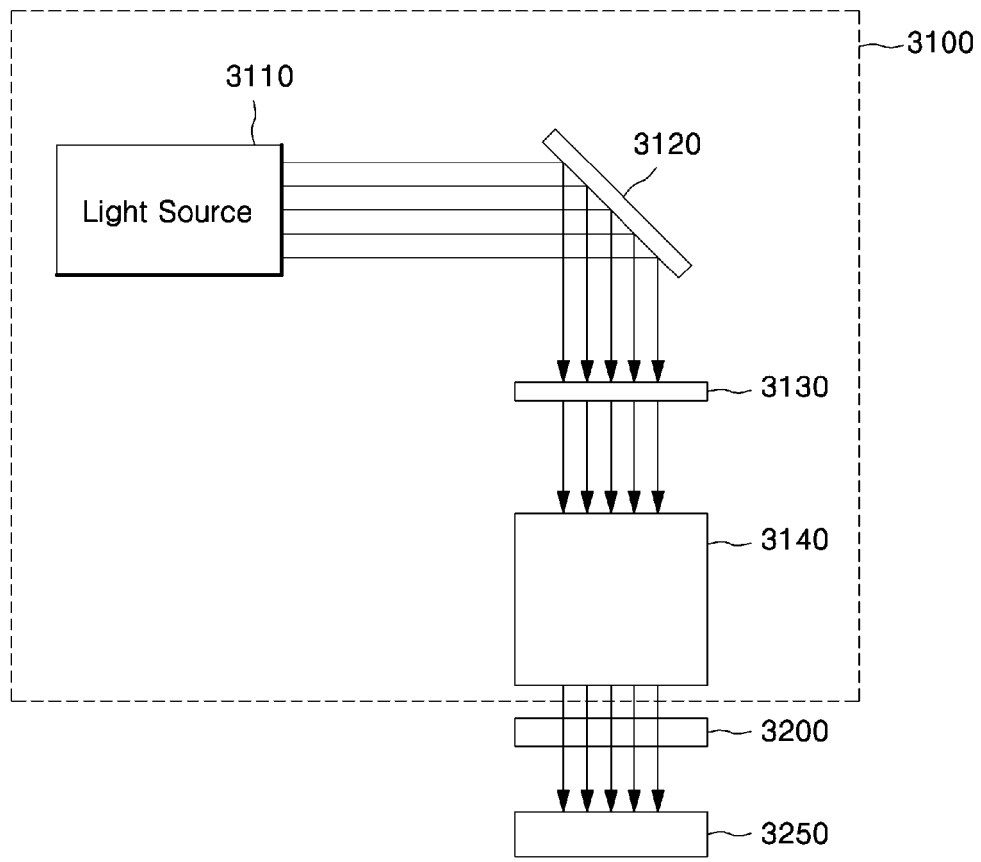
FIG. 60 is a schematic structural view of a maskless exposure apparatus according to an eighth implementation of the present disclosure.

FIG. 60 is a schematic structural view of a maskless exposure apparatus according to an eighth implementation of the present disclosure. The maskless exposure apparatus includes at least one maskless exposure part 3100.

The maskless exposure part 3100 includes a DMD 3120 for reflecting a light incident from the light source 3110 and projecting a light having at least two continuous overlapped patterns; a MAL 3130 arrayed with a plurality of lenses so as to divide the light projected from the DMD into a plurality of lights and collects the divided lights; and a projection lens for controlling resolutions of the lights collected by the MAL 3130 and transmitting the resultant lights.

In the maskless exposure part constituted as described above, the light source 3110 projects the light and the DMD 3120 reflects the light projected from the light source 3110 as the light having at least two continuous overlapped patterns.

In other words, the DMD 3120 reflects the light of the light source 3110 as a light having a first pattern and then reflects the light of the light source 3110 as a second pattern which is overlapped with the first pattern.

Therefore, the DMD 3120 continuously generates and projects the lights having the overlapped first and second patterns.

Also, the MAL 3130 divides the light reflected from the DMD 3120 into a plurality of the lights and collects the divided lights and the projection lens 3140 controls resolutions of the lights collected by the MAL 3130 and transmits the resultant lights, thereby capable of exposing without a mask.

Therefore, as the DMD 3120 reflects the light having at least two continuous overlapped patterns, the maskless exposure apparatus can form overlapped exposure patterns on a glass and thus reduce the blur.

Meanwhile, the patterns are preferably overlapped by 25 to 75%.

Figure 61:
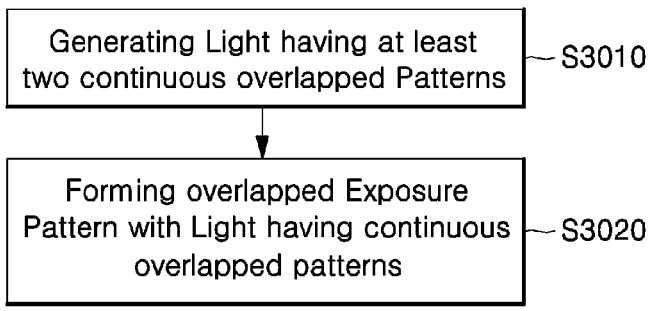
FIG. 61 is a schematic flowchart of the maskless exposure method according to an eighth implementation of the present disclosure.

FIG. 61 is a schematic flowchart of the maskless exposure method according to an eighth implementation of the present disclosure. The maskless exposure part generates the light having at least two continuous overlapped patterns (Step S3010).

Herein, the patterns are preferably overlapped by 25 to 75%.

After that, exposure patterns overlapped on the glass is formed by exposing the glass with the light having continuous overlapped patterns generated in the maskless exposure part (Step S3020).

Herein, in the step of forming the overlapped exposure patterns, the overlapped exposure patterns are preferably formed by scanning the glass by the times equal to the number of the continuous patterns with the maskless exposure part.

In other words, when the maskless exposure part scans the glass two times, the number of the continuous patterns is two, two patterns are formed on the glass and the two patterns are overlapped therebetween.

Also, when the maskless exposure part scans the glass three times, the number of the continuous patterns is three, three patterns are formed on the glass and the three patterns are overlapped therebetween.

Figure 62:
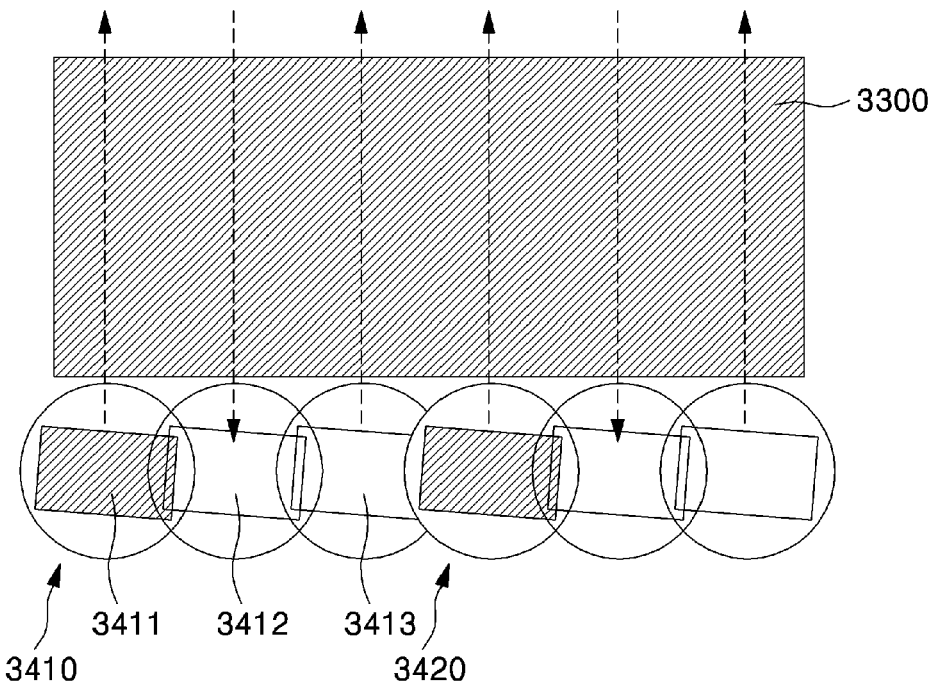
FIG. 62 is a conceptual view illustrating the maskless exposure method according to an eighth implementation of the present disclosure.

FIG. 62 is a conceptual view illustrating the maskless exposure method according to an eighth implementation of the present disclosure. When scanning and exposing the glass 3300 having a size of M×N (mm) with two maskless exposure parts 3410 and 3420, the respective maskless exposure parts 3410 and 3420 exposes the entire glass by scanning the glass three times.

In other words, the maskless exposure parts scan the glass plural times to form the exposure pattern.

At this time, the respective maskless exposure parts are provided with the DMD, and this DMD reflects the light while scanning the glass three times and this reflected light is formed of overlapped continuous patterns.

Therefore, as shown in FIG. 62, the region 3411 irradiated from the DMD upon first scanning, the region 3412 irradiated from the DMD upon second scanning and the region 3412 irradiated from the DMD upon third scanning are sequentially formed on the glass and the patterns are overlapped therebetween.

Figure 63:
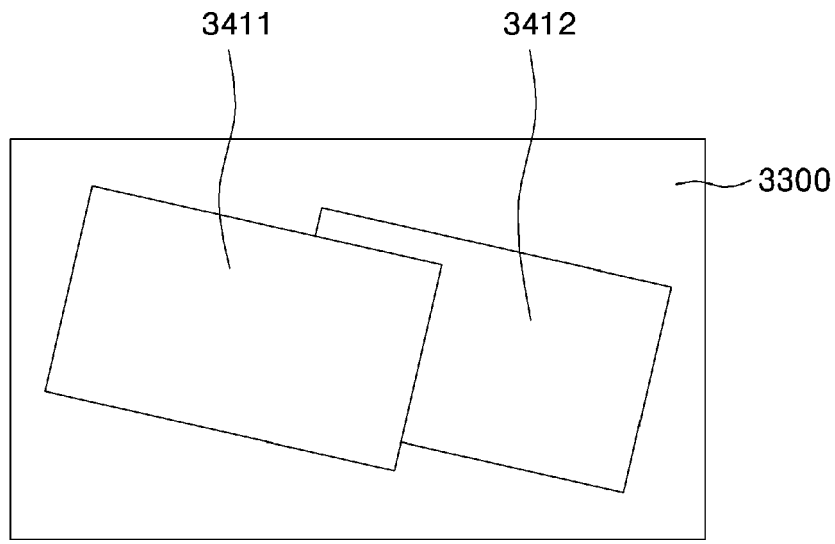
FIGS. 63 and 64 are schematic conceptual view illustrating a process of forming the overlapped exposure patterns according to the present disclosure.
Figure 64:
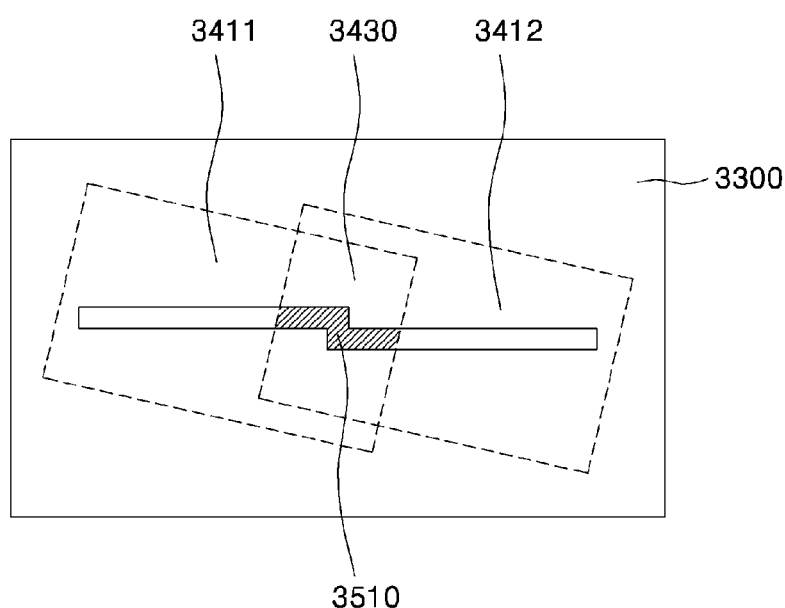

FIGS. 63 and 64 are schematic conceptual view illustrating a process of forming the overlapped exposure patterns according to the present disclosure. First, in a case the light having two continuous overlapped patterns is projected from the maskless exposure part, the regions 3411 and 3412 irradiated from the DMD in the maskless exposure part are overlapped as shown in FIG. 63 when the maskless exposure part scans the upper portion of the glass 3300 two times.

Therefore, as shown in FIG. 64, the exposed pattern is formed of the region 3411 irradiated upon first scan of the maskless exposure part and the region 3412 irradiated upon second scan, and the region 3411 irradiated upon first scan and the region 3412 irradiated upon second scan are overlapped with each other and the exposed pattern 3510 formed in the overlapped region 3430 is also overlapped.

Figure 65:
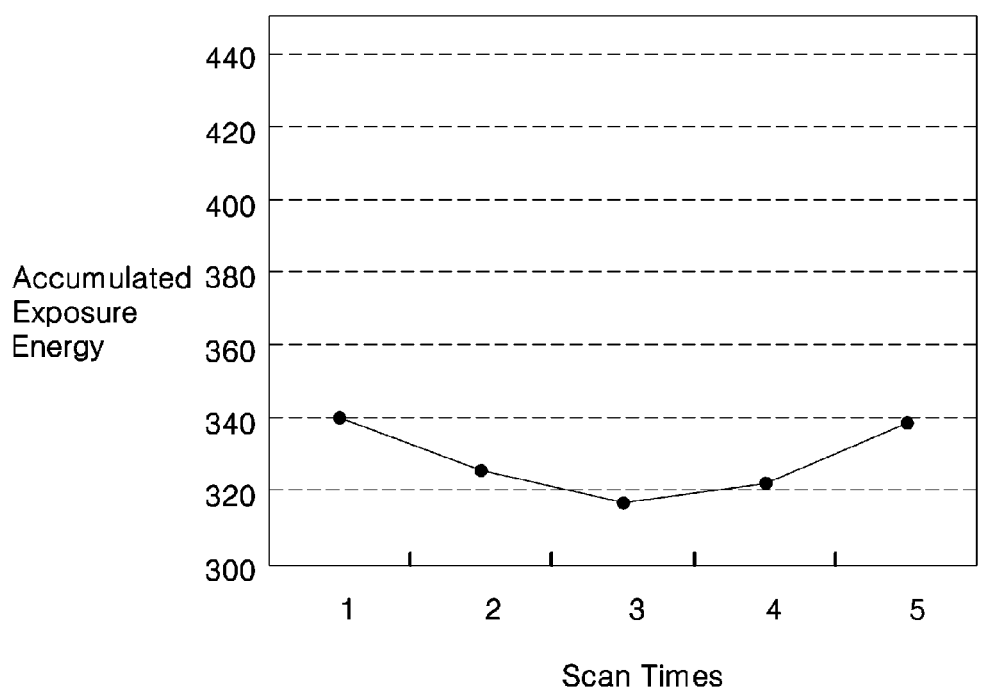
FIGS. 65 and 66 are graphs illustrating initial light intensity distributions of two maskless exposure parts according to the present disclosure.
Figure 66:
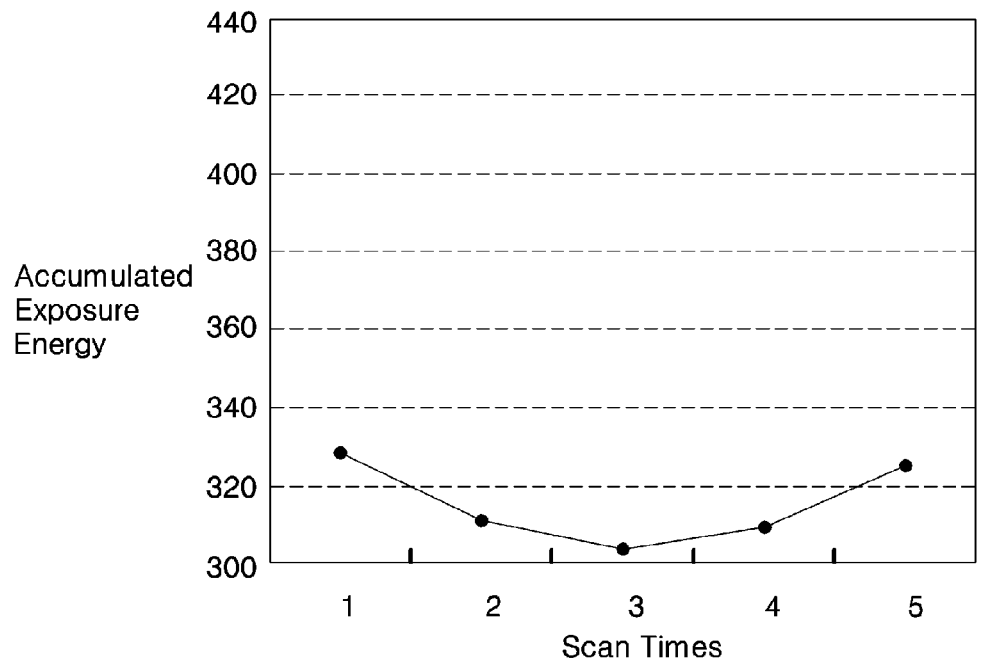

FIGS. 65 and 66 are graphs illustrating initial light intensity distribution of the two maskless exposure parts according to the present disclosure. As shown in FIGS. 65 and 66, it can be appreciated that the accumulated exposure energy according to the scan times of the two maskless exposure parts shows a Gaussian distribution.

At this time, initial light intensity distributions of the respective maskless exposure parts are 3.5% and 4.0%.

Therefore, since the maskless exposure parts have different light intensity distributions by variables having nonlinear properties such as an internal distortion between the maskless exposure parts and a resolution, a blur is formed in the exposed pattern.

In the present disclosure, such blur of the exposed pattern is reduced by overlapping the exposure patterns.

Figure 67:
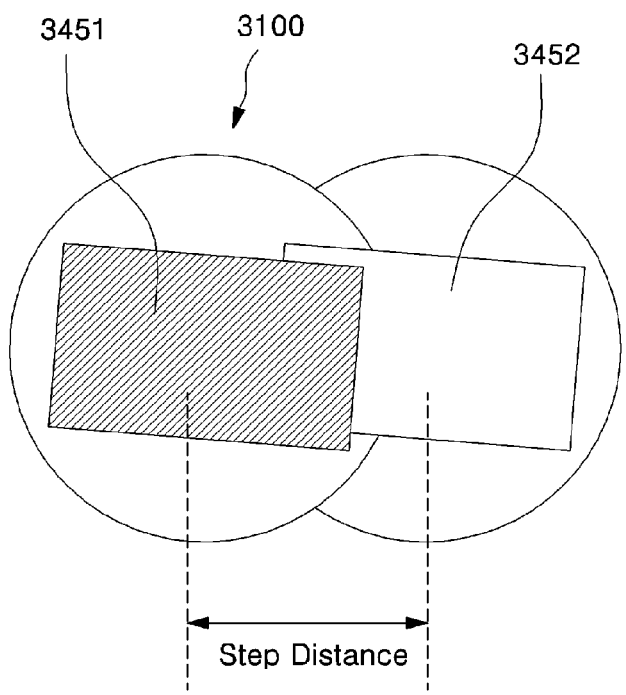
FIG. 67 is a schematic conceptual view illustrating a method for forming a 25% overlapped exposure pattern according to the present disclosure.

FIG. 67 is a schematic conceptual view illustrating a method for forming a 25% overlapped exposure pattern according to the present disclosure. The first region 3451 irradiated from the DMD of the maskless exposure part upon the first scan of the maskless exposure part 3100 and the second region 3452 irradiated from the DMD of the maskless exposure part upon the second scan are overlapped by 25%.

At this time, when defining a distance between the center of the first region 3541 and the center of the second region 3542 as a step distance, the step distance Lstep is inverse proportional to a scanning speed mode and a scanning speed is proportional to the scanning speed mode.

Therefore, it is possible to control the overlapped region by controlling the scanning speed mode.

In other words, the step distance is shortened by raising the scanning speed mode, and thus the overlapped region becomes widened.

Consequently, rising of the scanning speed widens the overlapped region.

Therefore, it is possible to overlap 25% of the region irradiated upon the first scan and the region irradiated upon the second scan by controlling the scanning speed.

Figure 68:
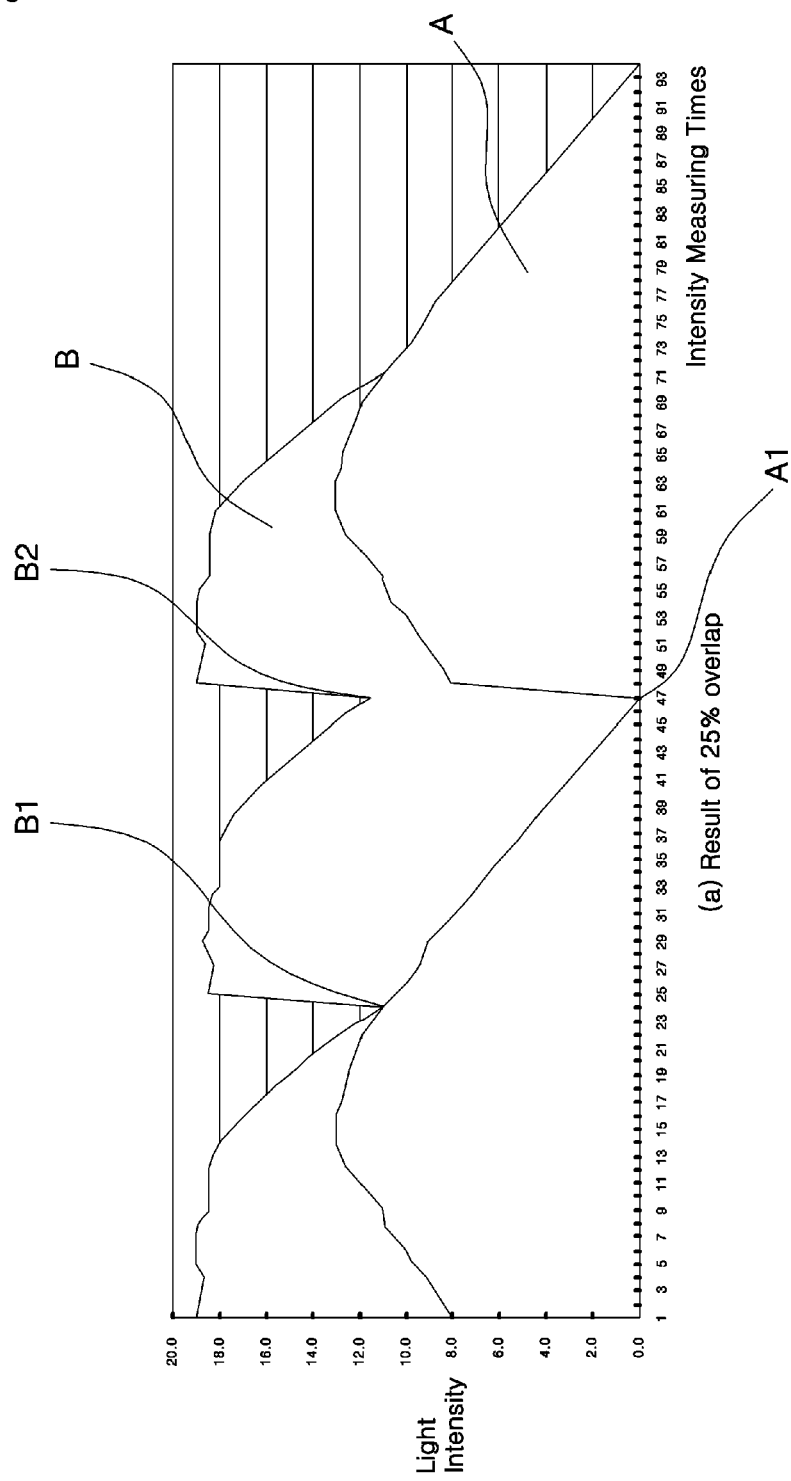

FIGS. 68 through 70 are graphs illustrating the light intensity distribution of the overlapped region according to the present disclosure. As described above, in the present disclosure, an overlapped exposure pattern is formed and thus the blur of the exposure pattern is removed.

At this time, the exposure pattern is preferably overlapped by 25 to 75%.

In other words, it is not easy to remove the blur when the overlapping is less than 25%, and an overexposure is performed and the thickness of the overlapped region is thickened when the overlapping is more than 75%.

First, in FIG. 68, a graph 'A' represents a light intensity distribution of a non-overlapped region and a graph 'B' represents a light intensity distribution of a 25% overlapped region.

Herein, it can be appreciated that since the light intensity has the Gaussian distribution, there is a region having almost no light intensity such as 'A1' and thus a blur is generated in the non-overlapped region and there is a large difference between a region having a peak light intensity and the region having almost no light intensity.

On the contrary, it can be appreciated that in the 25% overlapped region, there is a light intensity of a certain level even in the regions having the lowest intensity such as 'B1' and 'B2', and the difference between a region having a peak light intensity and the region having lowest light intensity is notably reduced compared to the light intensity distribution of the non-overlapped region and thus the blur is reduced.

Also, a graph 'C' in FIG. 69 represents a light intensity distribution of a 50% overlapped region and a graph 'D' in FIG. 70 represents a light intensity distribution of a 75% overlapped region.

Herein, it can be appreciated that light intensity of the regions having the lowest intensity C1, C2, C3, C4 and C5 in the 50% overlapped region in FIG. 69 and light intensity of the regions having the lowest intensity D1, D2, D3, D4, D5, D6 and D7 in the 75% overlapped region in FIG. 70 are higher than the intensity of the region having the lowest intensity in the 25% overlapped region, and the light intensity becomes uniform and thus the blur is reduced as the overlapped ratio is raised.

That is to say, by overlapping the exposure pattern, an intensity profile in the overlapped region is canceled to be uniform.

The aforementioned maskless exposure method of the second through sixth implementations is preferably performed after the step of moving and aligning the MAL or SLM for correcting the misalignment error of the maskless exposure method of the first implementation.

While the present novel concept has been described with reference to the particular illustrative implementations, it is not to be restricted by those implementations but only by the appended claims, It is to be appreciated that those skilled in the art can change or modify the implementations without departing from the scope and sprit of the present disclosure.

INDUSTRIAL APPLICABILITY

According to the present disclosure, it is possible to provide a maskless exposure method capable of reducing generation of a blur in the exposure pattern since it is possible to perform optical alignment of the maskless exposure part more precisely.

The invention claimed is:

1. A maskless exposure method, comprising: preparing a maskless exposure part including a light source for projecting a light, a Spatial Light Modulator (SLM) for reflecting the light projected from the light source as a light having a first pattern, a Multi-Array Lens (MAL) arrayed with a plurality of lenses so as to divide the light having the first pattern reflected from the SLM into a plurality of lights and collect the divided lights, and a projection lens for controlling resolutions of the lights collected by the MAL and transmitting the resultant lights; irradiating the light of the first pattern from the maskless exposure part to a Main Reference Unit (MRU) formed of a light transmissive material and formed with a second pattern that does not transmit the light having the first pattern; photographing the light transmitted through the MRU at a MRU camera; calculating a misalignment error with the first and second patterns represented in an image photographed by the MRU camera; and moving and aligning the MAL or the SLM for correcting the misalignment error.

2. The method as claimed in claim 1, wherein in the step of calculating the misalignment error with the first and second patterns represented in the image photographed by the MRU camera, a center of gravity with respect to brightness of the respective regions divided is calculated from the image photographed by the MRU camera and the misalignment error is calculated from the calculated center of gravity.

3. The method as claimed in claim 1, wherein the SLM is a Digital Micromirror Device (DMD).

4. The method as claimed in claim 3, wherein the maskless exposure part is further provided with an aligning camera for the reference for aligning optical centers of the DMD, MAL and MRU, and wherein the method further comprises, after the step of moving and aligning the MAL or the SLM for correcting the misalignment error, the steps of: making the optical centers of the DMD, MAL and MRU to agree with a first axis (P1); making the optical centers of the aligning camera and the MRU to agree with a second axis by moving the MRU camera in an exposure scanning direction; and measuring an offset between the first axis (P1) and the second axis (P2) and correcting the DMD, MAL and MRU with the offset so that the optical centers of the DMD, MAL and MRU agree with one another.

5. The method as claimed in claim 3, wherein the method further comprises, after the step of moving and aligning the MAL or the SLM for correcting the misalignment error, the step of correcting misalignment of the DMD, MAL and MRU.

6. The method as claimed in claim 5, wherein in the step of correcting misalignment of the DMD, MAL and MRU, a stripe pattern is inputted into the DMD, a scan for the exposure is performed at least two times, errors of the respective scanned patterns are measured and angles of the DMD and MAL are corrected with the error.

7. The method as claimed in claim 5, wherein in the step of correcting misalignment of the DMD, MAL and MRU, at least two cross-shaped patterns are irradiated from the DMD in a direction of 45 degree and the magnification of the projection lens is corrected through a comparison of the cross-shaped patterns with the second pattern of the MRU.

8. The method as claimed in claim 5, wherein the maskless exposure part is provided in plural, and wherein in the step of correcting misalignment of the DMD, MAL and MRU, lights having the same patterns are projected from the projection lenses of the plurality of maskless exposure parts, a layer is exposed with the lights, positional errors and angular errors of the respective patterns formed on the layer are measured and spaces of the scanning axes of the projection lenses are corrected on the basis of the measured errors.

9. The method as claimed in claim 5, wherein the maskless exposure part is provided in plural, and wherein in the step of correcting misalignment of the DMD, MAL and MRU, lights having the same patterns are projected from a pair of the projection lenses of adjacent maskless exposure parts, a test region is exposed with one projection lens, the other projection lens is moved to the test region to expose the test region, a space error of an X-axis perpendicular to an exposure scanning axis of the pair of the projection lenses is obtained with amount of movement of the other projection lens and difference between the centers of the exposed patterns, and the X-axis space of the pair of the projection lenses is corrected with the obtained X-axis space error.

10. The method as claimed in claim 1, wherein the method further comprises, after the step of moving and aligning the MAL or the SLM for correcting the misalignment error, the steps of: exposing a predetermined object with the maskless exposure part; measuring a Critical Dimension (CD) of a pattern exposed on the object; determining whether the measured CD of the pattern is within a reference CD range; and correcting the CD by decreasing threshold light quantity of the maskless exposure part when the measured CD of the pattern is out of the reference CD range.

11. The method as claimed in claim 3, wherein the DMD is provided with a plurality of pixels for reflecting the light projected from the light source, wherein the method further comprises, after the step of moving and aligning the MAL or the SLM for correcting the misalignment error, the steps of: exposing a predetermined object by projecting a pattern light formed by selective turning-on of the pixels of the DMD from the maskless exposure part; measuring an accumulated exposure energy of the maskless exposure part; determining whether the measured accumulated exposure energy is higher than a reference exposure energy; and making the accumulated exposure energy of the maskless exposure part to agree with the reference exposure energy by turning off some of the turned-on pixels of the DMD when the measured accumulated exposure energy is higher than the reference exposure energy.

12. The method as claimed in claim 11, wherein in the measuring the accumulated exposure energy, the region of the exposed object is divided into a plurality of regions and the accumulated exposure energy is measured in the respective divided regions, in the determining whether the measured accumulated exposure energy is higher than the reference exposure energy, whether the accumulated exposure energy measured in the respective divided regions is higher than a reference exposure energy is determined, and the accumulated exposure energy of the maskless exposure part is made to agree with the reference exposure energy by turning off some of the turned-on pixels of the DMD for exposing the divided regions when the measured accumulated exposure energy is higher than the reference exposure energy.

13. The method as claimed in claim 12, wherein each of the divided regions is one pixel of the turned-on DMD, and in making the accumulated exposure energy to agree with the reference exposure energy, some of the turned-on pixels of the DMD for exposing the respective divided regions are turned off to make the accumulated exposure energy to agree with the reference exposure energy.

14. The method as claimed in claim 3, wherein the DMD is provided with a plurality of pixels for reflecting the light projected from the light source, wherein the method further comprises, after the step of moving and aligning the MAL or the SLM for correcting the misalignment error, the steps of: projecting a pattern light formed by selective turning-on of the pixels of the DMD from the maskless exposure part; measuring an intensity of the pattern light projected from the maskless exposure part; generating a blank image capable of turning off some of the turned-on pixels of the DMD with the measured light intensity; and exposing a predetermined object with the maskless exposure part by turning off some of the turned-on pixels of the DMD according to the generated blank image.

15. The method as claimed in claim 14, wherein in a case that the maskless exposure part is arranged in plural, exposure is performed with the respective maskless exposure parts by overlapping the blank images in boundary portions of the respective scanning regions.

16. The method as claimed in claim 1, wherein the method further comprises, after the step of moving and aligning the MAL or the SLM for correcting the misalignment error, the steps of: measuring a working distance between the maskless exposure part and an object; determining whether the measured working distance is within a reference working distance; exposing the object with the maskless exposure part by moving the MAL alone of the maskless exposure part and controlling a focus when the measured working distance is not within a reference working distance.

17. The method as claimed in claim 1, wherein the maskless exposure part is provided in plural, and wherein the method further comprises, after the step of moving and aligning the MAL or the SLM for correcting the misalignment error, the steps of: placing a stage, on which an object to be exposed can be laid, at a lower portion of the maskless exposure parts; scanning the stage with the maskless exposure parts; subdividing a trace of the stage scanned by the respective maskless exposure parts into a plurality of positions and extracting focus distances of the respective maskless exposure parts at the plurality of subdivided positions; laying the object to be exposed on the stage; and exposing the object with the maskless exposure parts while maintaining the focus distance extracted at the plurality of subdivided positions.

18. The method as claimed in claim 17, wherein the step of exposing the object with the maskless exposure parts while maintaining the focus distance extracted at the plurality of subdivided positions is a step of exposing the object with the maskless exposure parts while maintaining the extracted focus distance by macro-driving a stage leveling motor provided in the stage on which the object is laid and micro-driving with an actuator for driving the MAL along a Z-axis.

19. The method as claimed in claim 1, wherein the method further comprises, after the step of moving and aligning the MAL or the SLM for correcting the misalignment error, the steps of: generating a light having at least two overlapped continuous patterns in the maskless exposure part; and forming an overlapped exposure pattern on a glass by exposing a glass with the overlapped patterns generated in the maskless exposure part.

20. The method as claimed in claim 19, wherein in the step of the forming the overlapped exposure patterns generated in the maskless part, the overlapped exposure pattern is formed by scanning the glass with the maskless exposure part by times equal to the number of the continuous patterns.

21. A maskless exposure apparatus, comprising:
a maskless exposure part for exposing a light having a first pattern;
a Main Reference Unit (MRU) formed of a light transmissive material and formed with a second pattern that does not transmit the light having the first pattern;
a MRU camera photographing the light transmitted through the MRU;
a table (stage) on which an object is laid and being movably provided with a driving source.

22. The apparatus as claimed in claim 21, wherein the maskless exposure part further including,
a light source for projecting a light, a Spatial Light Modulator (SLM) for reflecting the light projected from the light source as a light having the first pattern, a Multi-Array Lens (MAL) arrayed with a plurality of lenses so as to divide the light having the first pattern reflected from the SLM into a plurality of lights and collect the divided lights, and a projection lens for controlling resolutions of the lights collected by the MAL and transmitting the resultant lights.

23. The apparatus as claimed in claim 22, wherein the SLM is a Digital Micromirror Device (DMD) having a plurality of the micromirrors and the first pattern is made by a region in the DMD from which the light is not reflected.

24. The apparatus as claimed in claim 21, wherein the MRU camera being provided at one side of the table and moved with the table.

25. The apparatus as claimed in claim 21, further comprising a control part for calculating a misalignment error with the first and second patterns represented in an image photographed by the MRU camera and generating a signal to move the MAL or the SLM for correcting the misalignment error.

* * * * *